US012648076B2

(12) United States Patent
Fujishita et al.

(10) Patent No.: US 12,648,076 B2
(45) Date of Patent: Jun. 2, 2026

(54) BOARD LAMINATE, ROTATING ELECTRICAL MACHINE, AND FLEXIBLE CIRCUIT BOARD

(71) Applicant: HONDA MOTOR CO., LTD., Tokyo (JP)

(72) Inventors: Kimitoshi Fujishita, Wako (JP); Daiki Suetsugu, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 226 days.

(21) Appl. No.: 18/739,396

(22) Filed: Jun. 11, 2024

(65) Prior Publication Data

US 2025/0008641 A1 Jan. 2, 2025

(30) Foreign Application Priority Data

Jun. 28, 2023 (JP) ................................. 2023-106485

(51) Int. Cl.
*H02K 1/12* (2006.01)
*H02K 1/22* (2006.01)
*H05K 1/02* (2006.01)

(52) U.S. Cl.
CPC ............. *H05K 1/0277* (2013.01); *H02K 1/12* (2013.01); *H02K 1/22* (2013.01); *H05K 1/0203* (2013.01)

(58) Field of Classification Search
CPC ...... H05K 1/0277; H05K 1/0203; H02K 1/12; H02K 1/22; H02K 3/26
See application file for complete search history.

(56) References Cited

U.S. PATENT DOCUMENTS

2009/0072651 A1* 3/2009 Yan .................... H02K 15/0407
336/200
2022/0069657 A1* 3/2022 Morita ..................... H02K 3/26

FOREIGN PATENT DOCUMENTS

JP S55-127852 A 10/1980
JP H11-297557 A 10/1999
JP 2006-067756 A 3/2006

* cited by examiner

*Primary Examiner* — Thomas Truong
(74) *Attorney, Agent, or Firm* — Rankin, Hill & Clark LLP

(57) ABSTRACT

A board laminate includes a plurality of strip-shaped flexible circuit boards bent into a cylindrical shape and stacked in a radial direction of the cylinder. Each of a plurality of the flexible circuit boards includes a strip-shaped insulating sheet, a plurality of partial wires formed on each of two main surfaces of the insulating sheet, and protrusions placed on long sides extending in a longitudinal direction of the strip-shaped insulating sheet. When a plurality of flexible circuit boards are stacked together so that positions of their protrusions are aligned, the protrusions are each provided at a position where the partial wires corresponding among a plurality of flexible circuit boards are to be stacked together.

11 Claims, 15 Drawing Sheets

RELATED TECHNIQUE

FIG.9

CROSS-SECTIONAL VIEW TAKEN ALONG LINE X-X

BOARD LAMINATE, ROTATING ELECTRICAL MACHINE, AND FLEXIBLE CIRCUIT BOARD

INCORPORATION BY REFERENCE

The present application claims priority under 35 U.S.C. § 119 to Japanese Patent Application No. 2023-106485 filed on Jun. 28, 2023. The content of the application is incorporated herein by reference in its entirety.

BACKGROUND OF THE INVENTION

Field of the Invention

The present invention relates to a board laminate, a rotating electrical machine including the same, and a flexible circuit board forming the board laminate.

Description of the Related Art

In recent years, efforts to realize a low-carbon society or decarbonized society have been more active, and research and development has been conducted on electrification and weight reduction of vehicles in order to reduce $CO_2$ emissions and improve energy efficiency.

A known technique for reducing the weight of a motor required for electrification is to form the stator coil with a flexible circuit board. For example, Japanese Patent Laid-Open No. 2006-067756 describes forming a stator by winding and layering a strip-shaped insulating sheet in which a plurality of holes, into which cores of a magnetic material are inserted, and a plurality of coil patterns, each of which is formed in a spiral shape around the hole, are arrayed in the longitudinal direction. In this stator, coil patterns, which are layered together, are connected in cascade in the wound and layered insulating film, and thereby a laminated coil is formed around the hole.

Japanese Patent Laid-Open No. 11-297557 discloses a motor including teeth, forming a stator core, that are each sandwiched between a first sheet board and a second sheet board. The first sheet and the second sheet each have one side on which a plurality of conductive patterns are formed at constant intervals. Each first sheet board is bent into a recessed shape and fitted into each of the teeth, the first sheet board is then stacked on the second sheet board so that they face each other with each of the teeth interposed therebetween, and the ends of each conductive pattern are joined, thereby forming a coil with the teeth forming the core.

Japanese Patent Laid-Open No. 55-127852 discloses a coreless motor that includes an armature formed by stacking two flexible circuit boards and winding them into a cylindrical shape. Each flexible circuit board has one surface on which a dogleg-shaped parallel conductor wire group is formed, and a group of arrayed metal conductor protrusions is exposed toward the outside of the board from each of opposing ends of the parallel conductor wire group. Stacking two flexible circuit boards in opposite directions and winding them into a cylindrical shape, and joining the groups of arrayed metal conductor protrusions facing each other connects the individual conductor wires of the two parallel conductor wire groups of the two flexible circuit boards, to form a coil.

In the technique related to weight reduction of motors, a problem to be solved is to increase performance of a stator coil formed from a flexible circuit board to realize a motor with high energy efficiency.

Furthermore, this problem to be solved is common to rotating electrical machines including generators having the same configuration as motors.

In order to solve the above-mentioned problems, an object of the present application is to provide a board laminate of flexible circuit boards that can both reduce weight of a rotating electrical machine and improve energy efficiency thereof.

SUMMARY OF THE INVENTION

An aspect of the present invention is a board laminate including a plurality of strip-shaped flexible circuit boards bent into a cylindrical shape and stacked in a radial direction of the cylinder, in which each of a plurality of the flexible circuit boards includes a strip-shaped insulating sheet and a plurality of partial wires formed on each of two opposing main surfaces of the insulating sheet, each of a plurality of the flexible circuit boards includes at least one protrusion that is placed on at least one of two long sides extending in a longitudinal direction of the strip-shaped insulating sheet and protrudes from the long side toward an outside of the insulating sheet, and when a plurality of the flexible circuit boards are stacked so as to align the protrusions corresponding among the flexible circuit boards, the protrusions of the flexible circuit boards are each provided at a position where the partial wires corresponding among a plurality of the flexible circuit boards are to be stacked together.

According to another aspect of the present invention, the protrusion of the flexible circuit board is provided with a heat transfer pattern made of a material with higher thermal conductivity than the insulating sheet.

According to yet another aspect of the present invention, the heat transfer pattern is formed so as to extend from the protrusion to a long side of the insulating sheet.

According to yet another aspect of the present invention, the protrusion of the flexible circuit board is made of a material with higher thermal conductivity than the insulating sheet.

According to yet another aspect of the present invention, the flexible circuit board has at least one outer edge plate placed along the at least one of two long sides of the insulating sheet and made of a material with higher thermal conductivity than the insulating sheet, and the at least one protrusion is a portion of the outer edge plate, the portion extending from the outer edge plate.

According to yet another aspect of the present invention, a plurality of the protrusions of the flexible circuit board are placed on the opposing two long sides of the insulating sheet.

According to yet another aspect of the present invention, each of a plurality of the flexible circuit boards includes at least one continuous wire formed on the insulating sheet, and the continuous wire includes a first continuous portion and a second continuous portion, each formed by a plurality of the partial wires formed on two opposing main surfaces of the insulating sheet, the partial wires formed on each of the main surfaces being alternately connected in cascade via vias, the first continuous portion and the second continuous portion extending in the longitudinal direction of the insulating sheet.

According to yet another aspect of the present invention, in each of a plurality of the flexible circuit boards, the first continuous portion and the second continuous portion cross in a chain-like shape in a projection plan view seen in a normal direction of a main surface of the insulating sheet without electrical continuity with each other to form a plurality of annular portions ranged in a chain-like shape, and each of the annular portions forms a coil.

According to yet another aspect of the present invention, each of a plurality of the flexible circuit boards is provided with a plurality of the continuous wires formed at mutually shifted positions in the longitudinal direction of the insulating sheet.

Yet another aspect of the present invention is a rotating electrical machine including: a stator including the board laminate; and a rotor placed inside a cylinder formed by the board laminate.

Yet another aspect of the present invention is a plurality of flexible circuit boards forming a board laminate, and each of the flexible circuit boards includes: a strip-shaped insulating sheet; a plurality of partial wires formed on each of two opposing main surfaces of the insulating sheet; and at least one protrusion that is placed on at least one of two long sides extending in a longitudinal direction of the strip-shaped insulating sheet and protrudes from the long side toward an outside of the insulating sheet.

According to the aspects of the present invention, it is possible to provide a board laminate of flexible circuit boards that can both reduce weight of a rotating electrical machine and improve energy efficiency thereof.

BRIEF DESCRIPTION OF THE DRAWINGS

FIG. 9 is a diagram showing only a U-phase continuous wire of the flexible circuit board shown in FIG. 8 and omitting other continuous wires;

DETAILED DESCRIPTION OF THE PREFERRED EMBODIMENTS

The above-mentioned conventional technique requires a step of stacking a plurality of flexible circuit boards on which coil patterns are formed and then interconnecting the coil patterns of the flexible circuit boards. This disadvantageously results in a complicated manufacturing process and a complicated structure of the stator. Furthermore, in conventional configurations, the connection portions between the coil patterns are more likely to have discontinuous electrical resistance and generate heat than other conductor parts, due to use of a material different from the coil patterns (for example, welding material, conductive paste, etc.), or due to variations in connection area due to misalignment between the coil patterns in the manufacturing process. The heat generated in such a connection portion increases the temperature of a stator core around the coil pattern, lowers the magnetic susceptibility of the stator core, and can be a factor that deteriorates characteristics of the rotating electrical machine.

Embodiments will be described below.

1. First Embodiment

[1.1 Configuration of Flexible Circuit Board]

First, a configuration of a flexible circuit board 10 according to a first embodiment will be described.

Figure 1:
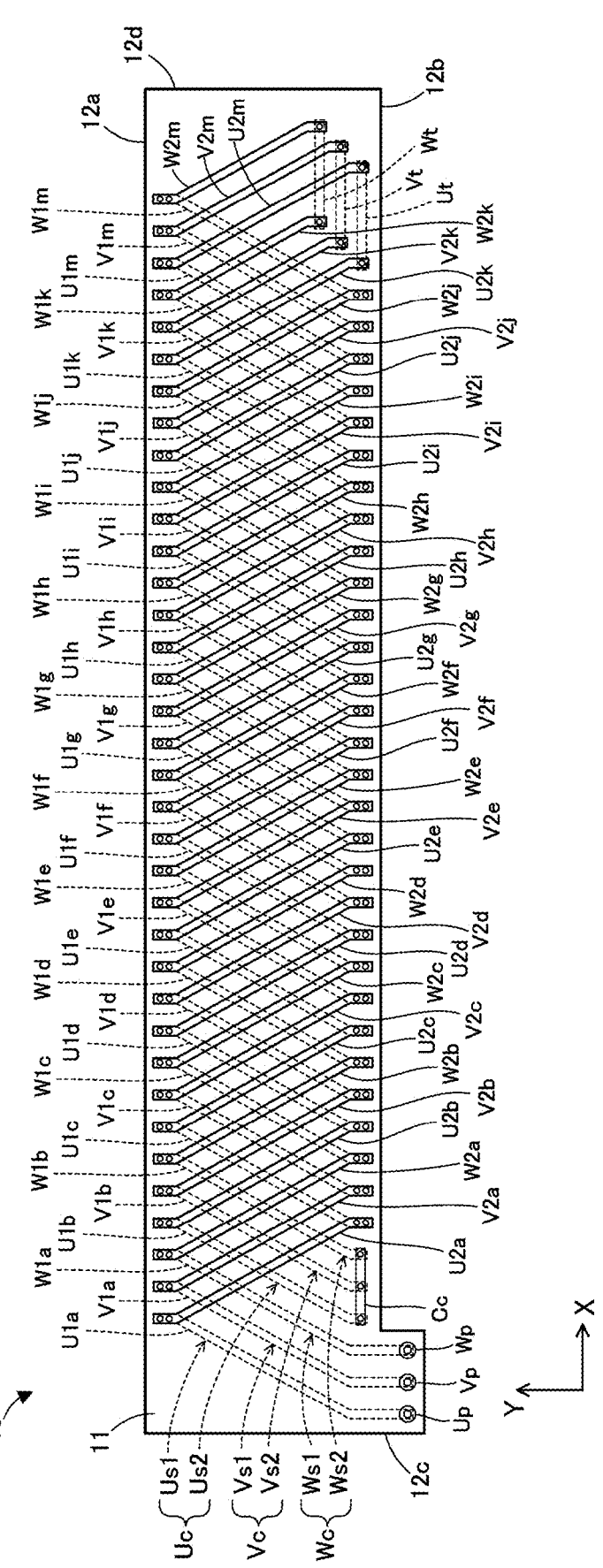
FIG. 1 is a diagram showing a configuration of a flexible circuit board according to a first embodiment.

The flexible circuit board 10 shown in FIG. 1 is used to form a stator of a rotating electrical machine. The rotating electrical machine including the flexible circuit board 10 is, for example, a motor 20 that is a three-phase brushless motor shown in FIG. 5. However, the rotating electrical machine in which the flexible circuit board 10 is used is not limited to a motor, and may be a generator constructed similarly to the motor 20, for example.

Figure 5:
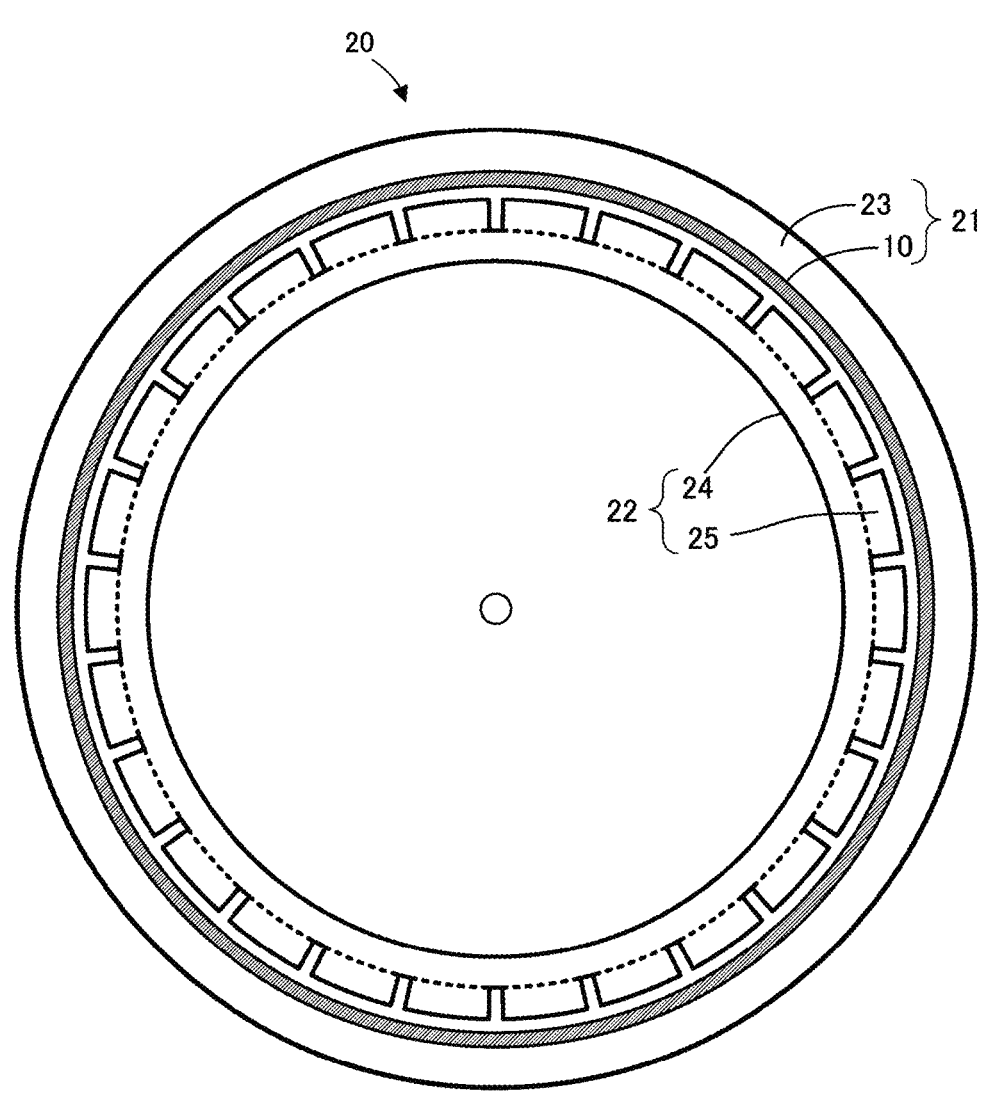
FIG. 5 is a diagram showing an example of a configuration of a motor in which the flexible circuit board shown in FIG. 1 is used.

The motor 20 shown in FIG. 5 includes a stator 21 and a rotor 22. The stator 21 is composed of a case 23 made of a soft magnetic material processed into a cup-shaped cylindrical shape, and a flexible circuit board 10 (portion indicated by hatching in FIG. 5) placed along the inner circumference of the case 23. As will be described later, wires forming coils are formed on the flexible circuit board 10. The rotor 22 includes a rotating body 24 which is a magnetic material processed into a cup-shaped cylindrical shape, and a plurality of permanent magnets 25 attached or embedded in the outer circumference of the rotating body 24.

The flexible circuit board 10 that forms the coil is used for the stator 21, and thereby the weight of the stator can be reduced compared to a configuration in which the conductor is wound to form a coil like a general stator. Note that the stator 21 may be arranged on the inner circumferential side of the rotor 22.

With reference to FIG. 1, the flexible circuit board 10 includes a flexible strip-shaped insulating sheet 11 extending left and right in the figure, and first partial wires U1, second partial wires U2, etc. (described later) that are a plurality of conductor patterns formed on two opposing main surfaces of the insulating sheet 11, respectively. The partial wires formed on the two main surfaces are alternately connected in cascade via vias to form three independent continuous wires Uc, Vc, and Wc. The three continuous wires Uc, Vc, and Wc are supplied with line currents (hereinafter simply referred to as currents) of the U-phase, V-phase, and W-phase of three-phase AC from external terminals Up, Vp, and Wp, respectively.

The three continuous wires Uc, Vc, and Wc respectively include sets of a first continuous portion and a second continuous portion: Us1 and Us2; Vs1 and Vs2; and Ws1 and Ws2, each extending in the longitudinal direction of the insulating sheet 11. In the continuous wires Uc, Vc and Wc, the first continuous portions Us1, Vs1, and Ws1 respectively cross the second continuous portions Us2, Vs2 and Ws in a chain-like shape without electrical continuity with each other, in a projection plan view seen in the normal direction of the main surface of the insulating sheet 11 (for example, a plan view shown in FIG. 1). Then, in the continuous wires Uc, Vc, and Wc, the chain-like crossings of the first continuous portions Us1, Vs1, and Ws1 with the respective second continuous portions Us2, Vs2, and Ws2 form a plurality of annular portions ranged in a chain-like shape. Each of these annular portions forms one coil.

Hereinafter, the main surface of the flexible circuit board 10 shown in FIG. 1 is referred to as a second main surface or front surface, and the main surface opposite to the second main surface shown in FIG. 1 is referred to as a first main surface or back surface. Furthermore, in FIG. 1, the conductor pattern formed on the first main surface (back surface) is shown by a broken line, and the conductor pattern formed on the second main surface (front surface) is shown by a solid line. The same applies to other drawings showing the configuration of the flexible circuit board.

In FIG. 1, the left-right direction in the figure, which is the longitudinal direction of the strip-shaped insulating sheet 11, is defined as an X direction (the right direction in the figure is +X direction), and the up-down direction in the figure, which is the width direction of the insulating sheet 11 orthogonal to the X direction, is defined as a Y direction (the upper direction in the figure is +Y direction).

Of the two sides extending in the longitudinal direction (±X direction) of the strip-shaped insulating sheet 11, the side on the upper side in the figure is called a long side 12*a*, and the side on the lower side in the figure is called a long side 12*b*. Furthermore, of the two sides extending in the width direction (±Y direction) of the strip-shaped insulating sheet 11, the side on the left side in the figure is called a short side 12*c*, and the side on the right side in the figure is called a short side 12*d*.

In the motor 20, the flexible circuit board 10 is bent into a cylindrical shape so that the short sides 12*c* and 12*d* face each other, and is placed in the case 23. The inner surface of the cylinder in the bent state may be either of the first main surface and the second main surface of the insulating sheet 11. In the present embodiment, for example, the inner surface of the cylinder is the second main surface (front surface).

The following describes a configuration of the three continuous wires Uc, Vc, and Wc, formed on the flexible circuit board 10, to which U-phase, V-phase, and W-phase currents are applied.

Figure 2:
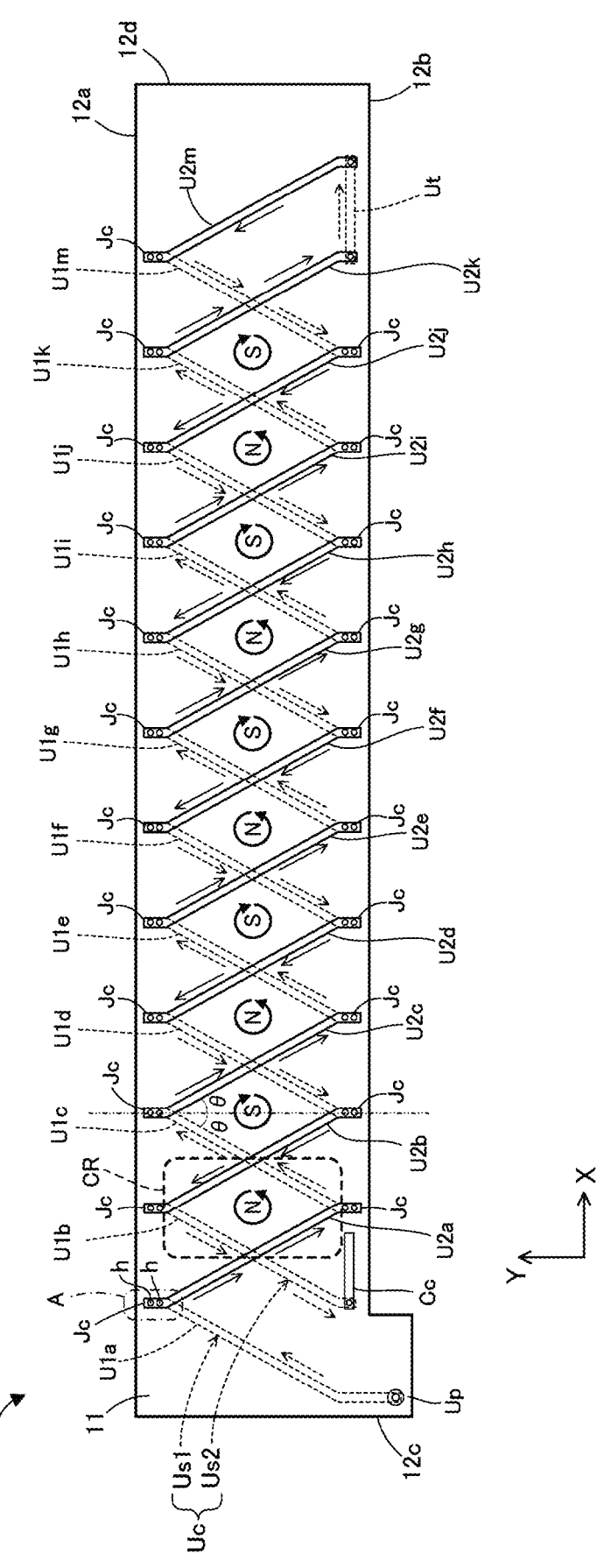
FIG. 2 is a diagram showing only a U-phase continuous wire of the flexible circuit board shown in FIG. 1 and omitting other continuous wires for the purpose of explanation.

For convenience of explanation, FIG. 2 is a diagram showing only the continuous wire Uc, to which the U-phase current is applied, of the three continuous wires Uc, Vc, and Wc formed on the flexible circuit board 10 shown in FIG. 1. In the flexible circuit board 10, the other continuous wires Vc and Wc, to which V-phase and W-phase currents are respectively applied, are constructed similarly to the U-phase continuous wire Uc shown in FIG. 2.

With reference to FIG. 2, the continuous wire Uc to which the U-phase current is applied includes a first continuous portion Us1 and a second continuous portion Us2 that extend in the X direction in the figure, which is the longitudinal direction of the insulating sheet 11. The first continuous portion Us1 is formed from first partial wires and second partial wires being alternately connected in cascade through vias h. The first partial wires are U1*a*, U1*c*, U1*e*, U1*g*, U1*i*, and U1*k* formed on the first main surface (back surface) of the insulating sheet 11, and the second partial wires are U2*a*, U2*c*, U2*e*, U2*g*, U2*i*, and U2*k* formed on the second main surface (front surface) thereof.

Furthermore, the second continuous portion Us2 is formed from first partial wires and second partial wires being alternately connected in cascade through the vias h. The first partial wires are U1*b*, U1*d*, U1*f*, U1*h*, U1*j*, and U1*m* formed on the first main surface (back surface), and the second partial wires are U2*b*, U2*d*, U2*f*, U2*h*, U2*j*, and U2*m* formed on the second main surface (front surface).

Hereinafter, the first partial wires U1*a*, U1*b*, U1*c*, U1*d*, U1*e*, U1*f*, U1*g*, U1*h*, U1*i*, U1*j*, U1*k*, and U1*m* are collectively referred to as the first partial wires U1. Furthermore, the second partial wires U2*a*, U2*b*, U2*c*, U2*d*, U2*e*, U2*f*, U2*g*, U2*h*, U2*i*, U2*j*, U2*k*, and U2*m* are also collectively referred to as the second partial wires U2.

Each of the vias h, which connects the first partial wire U1 and the second partial wire U2, is provided in the connection conductor portion Jc extending from each of the end portion of the first partial wire U1 and the end portion of the second partial wire U2 that are adjacent to each other toward the nearest long side 12*a* or 12*b*. Note that, in FIG. 2, only the vias of the connection conductor portion Jc at the upper left in the figure is denoted by the reference characters h, but it should be understood that vias are similarly provided in the other connection conductor portions Jc.

One end (the left end portion in FIG. 1) of the first continuous portion Us1 is connected to an external terminal Up into which the U-phase current is input. The other end of the first continuous portion Us1 (the right side end portion in FIG. 1) and one end of the second continuous portion Us2 (the right end in FIG. 1) are connected in cascade through the conductor pattern forming a reversal portion Ut, and are electrically continuous. The other end of the second continuous portion (the left side end portion in FIG. 1) is connected to the conductor pattern forming the common connection portion Cc. End portions of continuous wires Vc and Wc, to be described later, to which V-phase and W-phase currents are applied, are also connected to the common connection portion Cc (see FIG. 1). Thus connecting in this manner forms the continuous wire Uc that is electrically continuous through the external terminal Up, the first continuous portion Us1, the reversal portion Ut, the second continuous portion Us2, and the common connection portion Cc.

As illustrated, the first partial wires U1 and the second partial wires U2 are a plurality of linear conductor patterns arrayed in the longitudinal direction of the insulating sheet 11 in parallel to each other. The partial wires U1 and the second partial wires U2 each has the same line width. Furthermore, the first partial wires U1 and the second partial wires U2 incline at an acute angle θ with respect to a line segment (vertical line shown by two-dot chain line) in the Y direction (that is, the width direction of the insulating sheet 11) so as to be line-symmetrical to each other with respect to the line segment.

As a result, the first continuous portion Us1 and the second continuous portion Us2 included in the U-phase continuous wire Uc cross each other in a chain-like shape without electrical continuity (that is, the crossing of the first continuous portion Us1 and the second continuous portion Us2 is insulated by the insulating sheet 11 and is not electrically continuous), in a projection plan view seen in the normal direction of the main surface of the insulating sheet 11 (the normal direction to the paper surface in FIGS. 1 and 2). Then, one coil is formed from each of diamond-shaped annular portions CR that are formed by crossing of the first continuous portion Us1 and the second continuous portion Us2 and are ranged in a chain-like shape (in detail, the annular portions shown within a frame of a dotted line in the figure). Note that in FIG. 2, only the annular portion on the left side in the figure is denoted by the reference character CR, but it should be understood that each of the annular portions, which have the same diamond shape and are ranged in the horizontal direction in the figure, is the annular portion CR.

The diamond shape of the annular portion CR is formed because each first partial wire U1 and the second partial wire U2 are formed as linear conductor patterns inclined so as to be line-symmetrical to each other as described above.

For the purpose of description, in FIG. 2, an example is shown in which the direction of the U-phase current flowing from the external terminal Up is indicated by straight dotted line arrows or straight solid line arrows near each of the first partial wires U1 and the second partial wires U2. In this current direction, for example, the first diamond-shaped annular portion CR from the left in the figure is formed by: the first partial wire U1*c* and the second partial wire U2*a* forming the first continuous portion Us1; and the first partial wire U1*b* and the second partial wire U2*b* forming the second continuous portion Us2. The annular portion CR forms an equivalent coil in which the current flows counterclockwise, as shown by the thick circular arrow. As a result, an N pole is generated on the second main surface side (front surface side) of the first annular portion CR.

Furthermore, the second diamond-shaped annular portion CR from the left in the figure is formed by: the first partial wire U1*c* and the second partial wire U2*c* forming the first continuous portion Us1; and the first partial wire U1*d* and the second partial wire U2*b* forming the second continuous portion Us2. The annular portion CR forms an equivalent coil in which the current flows clockwise, as shown by the thick circular arrow. As a result, an S pole is generated on the second main surface side (front surface side) of the second annular portion CR.

Similarly, each annular portion CR forms a coil, and the adjacent coils generate magnetic poles that are opposite to each other. Furthermore, each coil has the magnetic field to be reversed by reversing the direction of U-phase current applied to external terminal Up, to generate an alternating magnetic field.

The coil formed by each of the annular portions CR forms one stator slot that generates a U-phase alternating magnetic field when the flexible circuit board 10 is placed in the case 23 of the motor 20. In the present embodiment, the ten annular portions CR forms ten U-phase stator slots.

In the present embodiment, two end portions of each first partial wire U1 formed on the first main surface of the insulating sheet 11 are respectively placed along two long sides 12*a* and 12*b* that face each other. Also, two end portions of the second partial wire U2 formed on the second main surface of the insulating sheet 11 are respectively placed along two long sides 12*a* and 12*b* that face each other. As a result, the annular portions CR, which are formed by crossing the first continuous portion Us1 and the second continuous portion Us2 in a chain-like shape, can spread over almost the entire width of the insulating sheet 11, and each have a large area secured, thereby generating a large magnetic force.

In the present embodiment, in particular, the vias h that alternately connect the first partial wires U1 and the second partial wires U2 are placed on the connection conductor portion Jc. Each connection conductor portion Jc extends from the end portions of each first partial wire U1 and the second partial wire U2 that overlap with the insulating sheet 11 interposed therebetween, toward the closer long side of the two long sides 12*a* and 12*b* of the insulating sheet 11. As described above, since the two end portions of each first partial wire U1 and the two end portions of each second partial wire U2 are placed along the two opposing long sides 12*a* and 12*b* of the insulating sheet 11, the connection conductor portions Jc are also placed along the long sides 12*a* and 12*b*.

Figure 3:
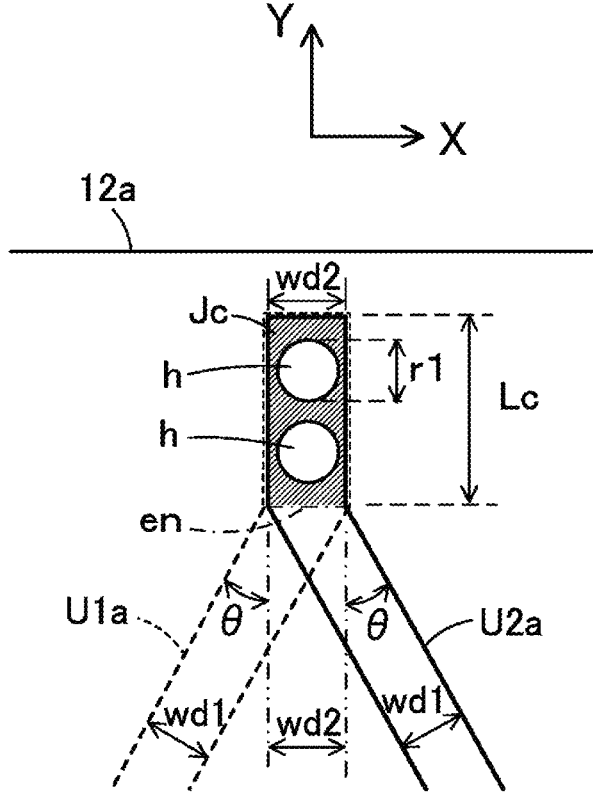
FIG. 3 is a partial detailed view of a part A shown in FIG. 2, and is a diagram showing a configuration of a connection conductor portion of the flexible circuit board shown in FIG. 1.

FIG. 3 is a partial detailed view of a part A shown in FIG. 2, and is a diagram showing a configuration of the connection conductor portion Jc. Note that in FIG. 2, the connection conductor portions Jc other than the part A are also configured in the same manner as the connection conductor portion Jc shown in FIG. 3.

With reference to FIG. 3, the first partial wire U1*a* and the second partial wire U2*a* are connected to a connection conductor portion Jc (hatched portion in the figure), from directions that are symmetrical to each other and form an acute angle of inclination angle θ with respect to the Y direction, which is the width direction of the insulating sheet 11. In FIG. 3, a dashed-dotted line en in the figure indicates the positions of the end portions of the first partial wire U1*a* and the second partial wire U2*a*.

Of the connection conductor portion Jc, a portion, which is formed on the second main surface (front surface) of the insulating sheet 11 (portion drawn with a solid line in the figure), extends from the end portion of the second partial wire U2*a* toward the closer long side 12*a* of the two long sides 12*a* and 12*b* of the insulating sheet 11 in the Y direction over a distance Lc. Similarly, of the connection conductor portion Jc, a portion, which is formed on the first main surface (back surface) of the insulating sheet 11 (portion drawn with a dotted line in the figure), extends from the end portion of the first partial wire U1*a* toward the long side 12*a* of the insulating sheet 11 over a distance Lc. Hereinafter, the distance Lc is also referred to as the extension distance Lc.

Here, the end portions of the first partial wire U1*a* and the second partial wire U2*a* indicated by the line en extends in the X direction, which is the longitudinal direction of the insulating sheet 11. The length wd2 of these end portions is the width measured in the longitudinal direction of each of the first partial wire U1*a* and the second partial wire U2*a*. The connection conductor portion Jc is formed as a rectangular pattern in which the width measured in the longitudinal direction (X direction) is wd2, which is the same as the length of the end portion, and the length measured in the width direction (Y direction) of the insulating sheet 11 is the extension distance Lc.

As a result, heat generated when a current flows through the vias h (white portions in the figure), which connects the first partial wire U1*a* and the second partial wire U2*a*, is quickly conducted to the vicinity of the long side 12*a* of the insulating sheet 11 via the conductor foil of the connection conductor portion Jc. Therefore, when the flexible circuit board 10 is housed in the case 23 of the motor 20, the generated heat is efficiently dissipated to the outside of the motor 20 from the long side 12a via the outer peripheral wall of the case 23.

The length wd2 of the end portions of the first partial wire U1a and the second partial wire U2a is given by the following expression (1) with respect to the line width wd1 of the first partial wire U1a and the second partial wire U2a (that is, the width in the direction orthogonal to the extending direction of each partial wire).

$$wd2 = wd1 \div \cos\theta \qquad (1)$$

Figure 4:
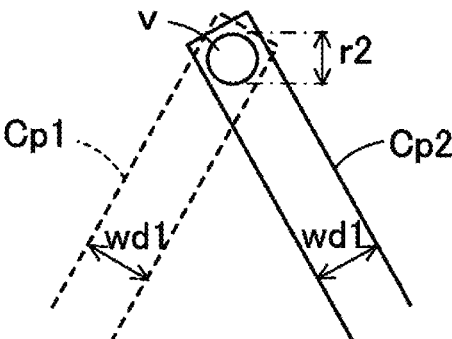
FIG. 4 is a diagram showing an example of a configuration related to related technique for connection between partial wires via vias.

Here, since the inclination angle θ is an acute angle (<90°), wd2 has a larger value than wd1. As a result, the diameter r1 of each circular via h formed in the connection conductor portion Jc can be set larger than the diameter r2 of a via v formed in a simple overlapping portion of two conductor patterns Cp1 and Cp2 each having a line width wd1 as shown in FIG. 4. Therefore, in the flexible circuit board 10, the electrical resistance in the via h can be made smaller than that in the via v having the configuration shown in FIG. 4, allowing the heat generated in the via h to be smaller than in the via v.

Furthermore, in the configuration shown in FIG. 4, the area for forming the via v is limited to the crossing portion of two linear conductor patterns Cp1 and Cp2. In contrast, in the flexible circuit board 10, the connection conductor portion Jc can increase its extension distance Lc, and thereby allows easily securing a larger region in which the via h can be formed. Therefore, in the flexible circuit board 10, a plurality of vias h are formed in one connection conductor portion Jc, to reduce the total electrical resistance of the connection conductor portion Jc including a plurality of the vias h, allowing the heat generated in the connection conductor portion Jc to be reduced further.

Note that, if the line width, corresponding to the above wd1, of the first partial wire U1a differs from that of the second partial wire U2a, the length of the end portion, corresponding to the above Wd2, of the first partial wire U1a differs from that of the second partial wire U2a thereof. In this case, the connection conductor portion Jc formed on the first main surface may be formed with the longitudinal width that is the length of the end portion, corresponding to the wd2, of the first partial wire U1a, and the connection conductor portion Jc formed on the second main surface may be formed with the longitudinal width that is the length of the end portion, corresponding to the wd2, of the second partial wire U2a.

Here, from the point of view of reducing heat generation in the connection conductor portion Jc, the electrical resistance, that is, the resistivity, per area of the connection conductor portion Jc including the vias h is desirably less than or equal to the resistivity of each of the first partial wire U1 and the second partial wire U2. The connection conductor portion Jc including the vias h means the entirety including the connection conductor portion Jc and the vias h formed in the connection conductor portion Jc. In the present embodiment, for example, two vias h are formed in one connection conductor portion Jc, and the resistivity of the connection conductor portion Jc including the two vias h is set smaller than each resistivity of the first partial wire U1 and the second partial wire U2. As a result, the electrical resistance value of the connection conductor portion Jc including the two vias h is smaller than each electrical resistance value of the first partial wire U1 and the second partial wire U2.

With reference to FIG. 1, the other two continuous wires Vc and Wc, respectively connected to the external terminals Vp and Wp, to which V-phase and W-phase currents are applied, are also configured in the same manner as the above-mentioned U-phase continuous wire Uc.

Specifically, the continuous wire Vc to which the V-phase current is applied includes a first continuous portion Vs1 and a second continuous portion Vs2 that extend in the X direction in the figure, which is the longitudinal direction of the insulating sheet 11. The first continuous portion Vs1 is formed from first partial wires and second partial wires being alternately connected in cascade through vias h provided in the corresponding connection conductor portions Jc. The first partial wires are V1a, V1c, V1e, V1g, V1i, and V1k formed on the first main surface (back surface) of the insulating sheet 11, and the second partial wires are V2a, V2c, V2e, V2g, V2i, and V2k formed on the second main surface (front surface) thereof.

The second continuous portion Vs2 is formed from first partial wires and second partial wires being alternately connected in cascade through vias h provided in the corresponding connection conductor portions Jc. The first partial wires are V1b, V1d, V1f, V1h, V1j, and V1m formed on the first main surface (back surface) of the insulating sheet 11, and the second partial wires are V2b, V2d, V2f, V2h, V2j, and V2m formed on the second main surface (front surface) thereof.

This forms the continuous wire Vc that is electrically continuous through the external terminal Vp, the first continuous portion Vs1, the reversal portion Vt, the second continuous portion Vs2, and the common connection portion Cc.

Furthermore, the first continuous portion Vs1 crosses the second continuous portions Vs2 in a chain-like shape without electrical continuity, in a projection plan view seen in the normal direction of the main surface of the insulating sheet 11. Then, one coil is formed from each of annular portions CR that are formed by the crossing and are ranged in a chain-like shape.

Similarly, the continuous wire Wc to which the W-phase current is applied includes a first continuous portion Ws1 and a second continuous portion Ws2 that extend in the X direction in the figure, which is the longitudinal direction of the insulating sheet 11. The first continuous portion Ws1 is formed from first partial wires and second partial wires being alternately connected in cascade through vias h provided in the corresponding connection conductor portions Jc. The first partial wires are W1a, W1c, W1e, W1g, W1i, and W1k formed on the first main surface (back surface) of the insulating sheet 11, and the second partial wires are W2a, W2c, W2e, W2g, W2i, and W2k formed on the second main surface (front surface) thereof.

Furthermore, the second continuous portion Ws2 is formed from first partial wires and second partial wires being alternately connected in cascade through vias h provided in corresponding connection conductor portions Jc. The first partial wires are W1b, W1d, W1f, W1h, W1j, and W1m formed on the first main surface (back surface) of the insulating sheet 11, and the second partial wires are W2b, W2d, W2f, W2h, W2j, and W2m formed on the second main surface (front surface) thereof.

This forms the continuous wire Wc that is electrically continuous through the external terminal Wp, the first continuous portion Ws1, the reversal portion Wt, the second continuous portion Ws2, and the common connection portion Cc.

Furthermore, the first continuous portion Ws1 crosses the second continuous portions Ws2 in a chain-like shape, in a projection plan view seen in the normal direction of the main surface of the insulating sheet 11. Then, one coil is formed from each of annular portions that are formed by the crossing and are ranged in a chain-like shape.

The above-mentioned annular portions formed by the continuous wires Vc and Wc each corresponds to the above-mentioned annular portion CR of the continuous wire Uc. Therefore, hereinafter, the annular portions formed by the continuous wires Vc and Wc are each referred to as an annular portions CR.

Hereinafter, the first partial wires V1*a*, V1*b*, V1*c*, V1*d*, V1*e*, V1*f*, V1*g*, V1*h*, V1*i*, V1*j*, V1*k*, and V1*m* are also collectively referred to as the first partial wires V1. Furthermore, the second partial wires V2*a*, V2*b*, V2*c*, V2*d*, V2*e*, V2*f*, V2*g*, V2*h*, V2*i*, V2*j*, V2*k*, and V2*m* are also collectively referred to as the second partial wires V2.

Similarly, the first partial wires W1*a*, W1*b*, W1*c*, W1*d*, W1*e*, W1*f*, W1*g*, W1*h*, W1*i*, W1*j*, W1*k*, and W1*m* are also collectively referred to as the first partial wires W1. Furthermore, the second partial wires W2*a*, W2*b*, W2*c*, W2*d*, W2*e*, W2*f*, W2*g*, W2*h*, W2*i*, W2*j*, W2*k*, and W2*m* are also collectively referred to as the second partial wires W2.

In FIG. 1, three continuous wires Uc, Vc, and Wc are formed so that their positions are spaced apart from each other by a predetermined distance in the longitudinal direction (X direction) of the insulating sheet 11. In the present embodiment, the predetermined distance is shorter than the length in the X direction of the annular portion CR forming the coil in each continuous wire. Therefore, the annular portions CR of the three continuous wires Uc, Vc, and Wc overlap each other.

In the flexible circuit board 10 having the above configuration, three continuous wires Uc, Vc, and Wc are formed on one insulating sheet 11. The continuous wires Uc, Vc, and Wc respectively have the first continuous portions Us1, Vs1 and Ws1 that respectively cross the second continuous portions Us2, Vs2, and Ws2 in a chain-like shape in a projection plan view seen in the normal direction of the main surface of the insulating sheet 11 without electrical continuity, to form a plurality of annular portions CR. The continuous wires Uc, Vc, and Wc each have a plurality of the annular portions CR forming coils that are connected in series with each other and generate magnetic poles opposite to each other in the adjacent annular portions.

In other words, the flexible circuit board 10 respectively have the coils, formed on the insulating sheet 11, for the U-phase, V-phase, and W-phase, each of which coils are connected in series to each other. Therefore, when a motor stator is formed with this, there is no conventional need for the following: pasting two circuit boards together; connecting a plurality of electrodes, provided on a circuit board, to each other; or individually applying currents to coils on a circuit board. Therefore, use of the flexible circuit board 10 allows simplifying the manufacturing process of a stator to reduce man-hours for manufacturing a motor. Furthermore, the flexible circuit board 10 does not require a step of connecting individual coils as described above. This prevents malfunction of the motor from being generated due to poor connection between the coils, to allow the production quality of the motor to be improved.

Furthermore, the flexible circuit board 10 has continuous wires Uc, Vc, and Wc, which respectively have first continuous portions Us1, Vs1, and Ws1 respectively crossing the second continuous portions Us2, Vs2, and Ws2 in a chain-like shape, to form a plurality of annular portions CR. The annular portions CR do not create gaps between adjacent annular portions CR, allowing for easily increasing the arrangement density of the coils formed by these annular portions CR on the insulating sheet 11. Therefore, when the motor 20 is formed with the flexible circuit board 10, the arrangement density of the stator slots in the stator 21 is high. As a result, the length of the magnetic path formed by the adjacent stator slots is shorter and the magnetic resistance is low, allowing the wall thickness of the case 23 of the stator 21 to be thinner accordingly. Thereby, the weight per volume of the motor 20 can be reduced.

Furthermore, in the present embodiment, the first partial wires U1, V1, and W1 and the second partial wires U2, V2, and W2, which form the continuous wires Uc, Vc, and Wc, are connected to each other by vias h formed in the connection conductor portions Jc each arrayed along the two long sides 12*a* and 12*b* of the insulating sheet 11. Furthermore, each of the connection conductor portions Jc is formed to extend toward the nearest long side 12*a* or 12*b*.

This causes the flexible circuit board 10 to efficiently conduct the heat generated when current flows through the vias h connecting the first partial wires U1, V1, W1 and the second partial wires U2, V2, W2 to the vicinity of the long side 12*a* or 12*b* of the insulating sheet 11 via the conductor foil of the connection conductor portions Jc. Therefore, when the flexible circuit board 10 is housed in the case 23 of the motor 20, the generated heat is efficiently dissipated to the outside of the motor 20 from the long side 12*a* or 12*b* via the outer peripheral wall of the case 23. This allows preventing the temperature rise in the portions, of the case 23 made of a soft magnetic material, that form the stator slots together with the annular portions CR of the continuous wires Uc, Vc, and Wc, to prevent decrease in the magnetic susceptibility of the portions. This then allows maintaining the operating performance of the motor 20 in continuous operation at a high level.

[1.2 Modification]

Figure 6:
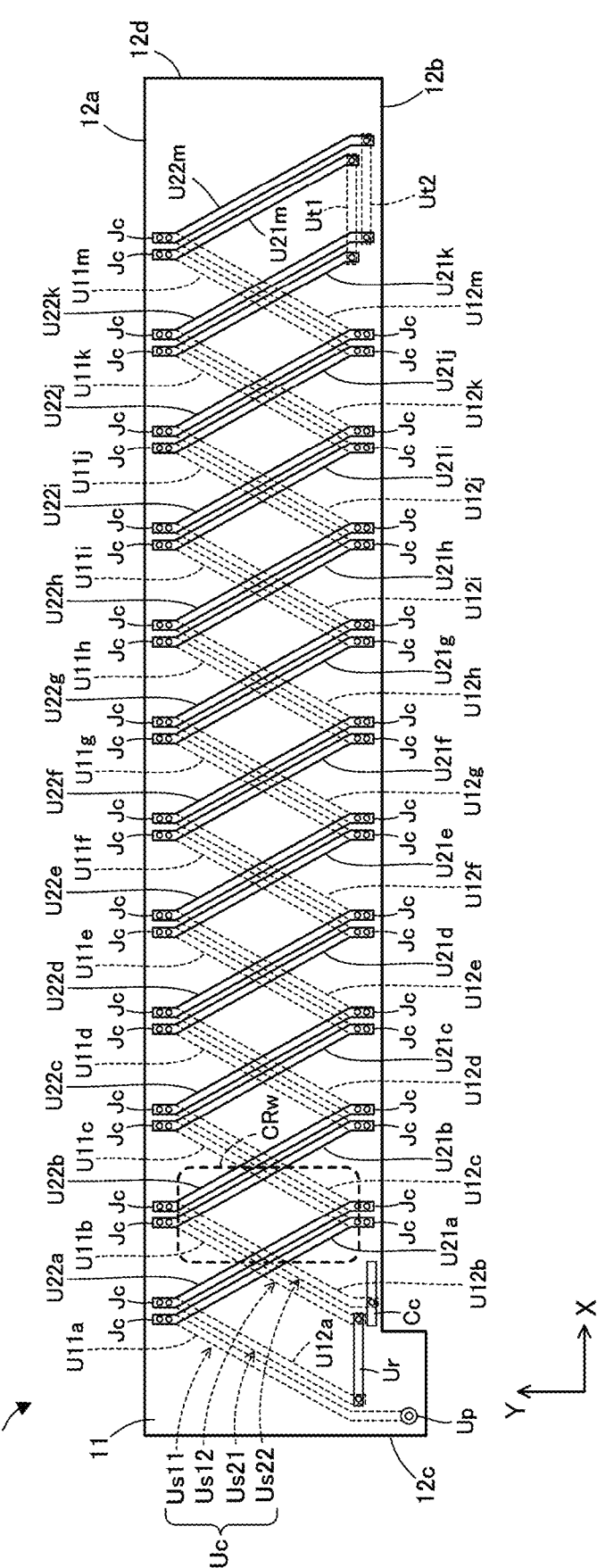
FIG. 6 is a diagram showing a configuration of a flexible circuit board according to a modification of the first embodiment.

Next, a modification of the flexible circuit board 10 will be described. FIG. 6 is a diagram showing a configuration of a flexible circuit board 101 according to a modification of the flexible circuit board 10, and is a diagram corresponding to FIG. 2 described above in which only the continuous wires Uc, to which current of the U-phase is applied, are shown. For convenience of explanation, FIG. 6 shows only U-phase continuous wires Uc, but V-phase and W-phase continuous wires Vc and Wc have the same configuration. The continuous wires Uc, Vc, and Wc of the U-phase, V-phase, and W-phase are formed to be apart from each other by a predetermined distance in the longitudinal direction (X direction) of the insulating sheet 11, similarly to the configuration described above in FIG. 1.

In this modification, the continuous wires Uc includes two first continuous portions Us11 and Us12 and two second continuous portions Us21 and Us22 that extend in one direction in the longitudinal direction of the insulating sheet 11 in parallel to each other. The first continuous portions Us11, Us12 and the second continuous portions Us21, Us22 are alternately connected in cascade in the following order: the first continuous portion Us11; the second continuous portion Us21; the first continuous portion Us12; and the second continuous portion Us22. Furthermore, the two first continuous portions Us11 and Us12 and the two second continuous portions Us21 and Us22 cross in a chain-like shape in a plan see-through shape seen in the normal direction of the main surface of the insulating sheet 11 without electrical continuity with each other.

Two first continuous portions Us11 and Us12 are constructed similarly to the first continuous portion Us1 in FIG. 2 described above. Two second continuous portions Us21 and Us22 are constructed similarly to the second continuous portion Us2 in FIG. 2 described above.

Specifically, the first continuous portion Us11 is formed from first partial wires and second partial wires being alternately connected in cascade through the vias h. The first partial wires are U11a, U11c, U11e, U11g, U11i, and U11k formed on the first main surface (back surface) of the insulating sheet 11, and the second partial wires are U21a, U21c, U21e, U21g, U21i, and U21k formed on the second main surface (front surface) thereof.

Furthermore, the first continuous portion Us12 is formed from first partial wires and second partial wires being alternately connected in cascade through the vias h. The first partial wires are U12a, U12c, U12e, U12g, U12i, and U12k formed on the first main surface (back surface) of the insulating sheet 11, and the second partial wires are U22a, U22c, U22e, U22g, U22i, and U22k formed on the second main surface (front surface) thereof.

The second continuous portion Us21 is formed from first partial wires and second partial wires being alternately connected in cascade through the vias h. The first partial wires consist of U11b, U11d, U11f, U11h, U11j, and U11m formed on the first main surface (back surface) of the insulating sheet 11, and the second partial wires consist of U21b, U21d, U21f, U21h, U21j, and U21m formed on the second main surface (front surface) thereof.

Furthermore, the second continuous portion Us22 is formed from first partial wires and second partial wires being alternately connected in cascade through the vias h. The first partial wires consist of U12b, U12d, U12f, U12h, U12j, and U12m formed on the first main surface (back surface) of the insulating sheet 11, and the second partial wires consist of U22b, U22d, U22f, U22h, U212, and U22m formed on the second main surface (front surface) thereof.

Hereinafter, the first partial wires U11a, U11b, U11c, U11d, U11e, U11f, U11g, U11h, U11i, U11j, U11k, and U11m are collectively referred to as the first partial wires U11. Furthermore, the first partial wires U12a, U12b, U12c, U12d, U12e, U12f, U12g, U12h, U12i, U12j, U12k, and U12m are collectively referred to as the first partial wires U12.

The second partial wires U21a, U21b, U21c, U21d, U21e, U21f, U21g, U21h, U21i, U21j, U21k, and U21m are collectively referred to as the second partial wires U21. Furthermore, the second partial wires U22a, U22b, U22c, U22d, U22e, U22f, U22g, U22h, U22i, U22j, U22k, and U22m are collectively referred to as the second partial wires U22.

In FIG. 6, the two first continuous portions Us11 and Us12 and the two second continuous portions US21 and Us22 are alternately connected in cascade by the relay portion Ur on the left side in the figure and the reversal portions Ut1 and Ut2 on the right side in the figure.

The two first continuous portions Us11 and Us12, which are the first continuous portions, and the two second continuous portions Us21 and Us22, which are the second continuous portions cross in a chain-like shape in a plan see-through shape seen in the normal direction of the main surface of the insulating sheet 11, to form a plurality of diamond-shaped annular portions CRw (such as the annular portion formed by the double surrounding partial wires in the dotted line frame in the figure). Each annular portion CRw shown in FIG. 6 forms one equivalent coil similarly to the annular portion CR in FIG. 2. However, the annular portions CRw shown in FIG. 6 differ from the annular portions CR in FIG. 2 in that each of the annular portions CRw is surrounded by a double diamond-shaped pattern formed by the first partial wires U11 and U12 and the second partial wire U21 and U22.

As a result, each coil formed by the diamond-shaped annular portion CRw corresponds to a coil with a number of turns of two, and is allowed to obtain a larger generated magnetic force than the coil formed by the annular portion CR shown in FIG. 2.

2. Second Embodiment

Next, a board laminate 30 according to a second embodiment will be described.

[2.1 Configuration of Board Laminate]

Figure 7:
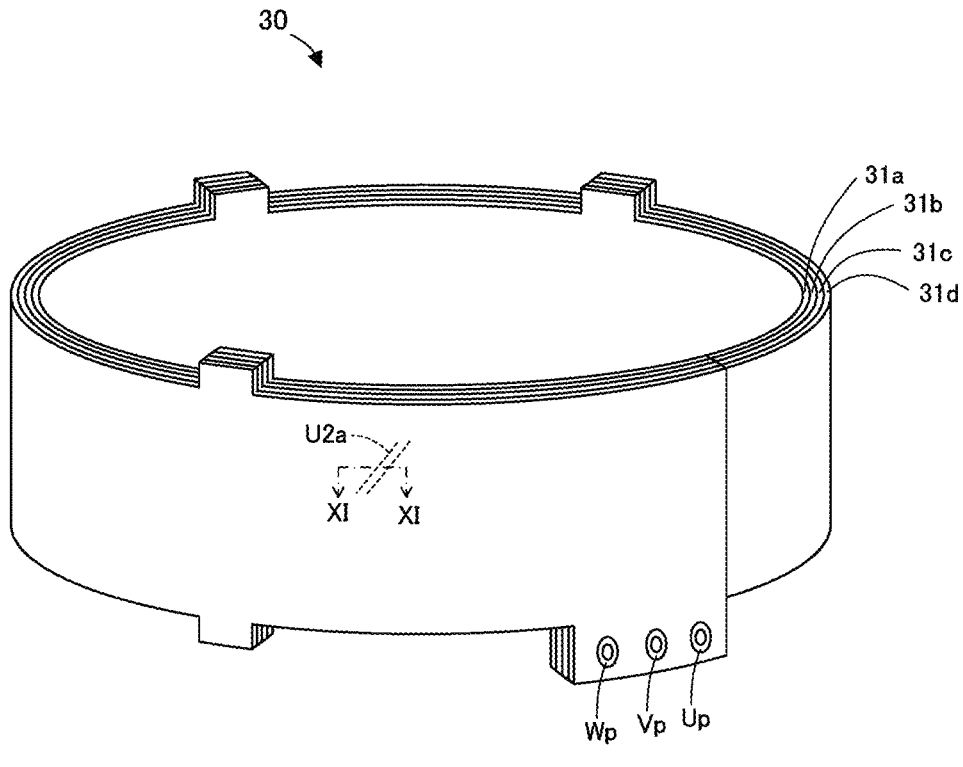
FIG. 7 is a diagram showing a configuration of a board laminate according to a second embodiment.

FIG. 7 is a diagram showing a configuration of the board laminate 30. The board laminate 30 is formed by stacking a plurality of strip-shaped flexible circuit boards and bending them into a cylindrical shape. In the present embodiment, the cylindrical board laminate 30 is formed by laminating four flexible circuit boards 31a, 31b, 31c, and 31d in this order from the inner circumference of the cylinder. Hereinafter, the flexible circuit boards 31a, 31b, 31c, and 31d are also collectively referred to as flexible circuit boards 31.

The board laminate 30 is used to form a stator of a rotating electrical machine. The rotating electrical machine including the board laminate 30 is, for example, a motor 40 that is a three-phase brushless motor shown in FIG. 11. However, the rotating electrical machine in which the board laminate 30 is used is not limited to a motor, but may be a generator constructed similarly to the motor 40, for example.

Figure 11:
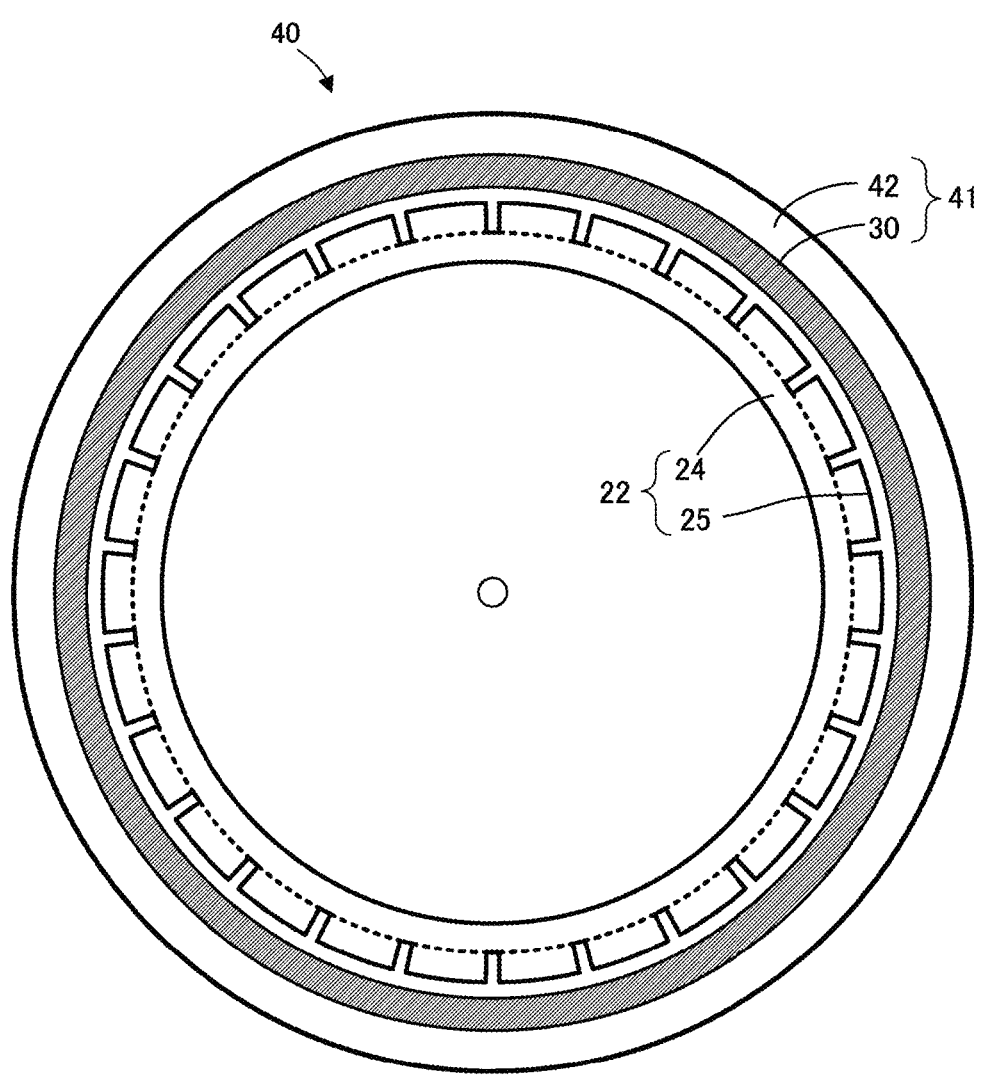
FIG. 11 is a diagram showing an example of a configuration of a motor in which the board laminate shown in FIG. 7 is used.

In addition, in FIG. 11, the same components as those of the motor 20 shown in FIG. 5 are denoted by the same reference signs as those in FIG. 5, and the description thereof quotes the description regarding FIG. 5 mentioned above. The motor 40 shown in FIG. 11 has a configuration similar to the motor 20, but includes a stator 41 instead of the stator 21. The stator 41 includes a case 42 that is a soft magnetic material processed into a cup-shaped cylindrical shape, and a board laminate 30 (portion indicated by hatching in FIG. 8) placed along the inner circumference of the case 42.

The four flexible circuit boards 31 can be assembled inside the case 42 in order along the inner circumference of the case 42, and thereby form the board laminate 30 shown in FIG. 7 as a whole. Alternatively, the four flexible circuit boards 31 may be stacked in advance and assembled into the board laminate 30 shown in FIG. 7 before being assembled into the case 42.

[2.2 Configuration of Flexible Circuit Board]

Next, a configuration of the flexible circuit boards 31 forming the board laminate 30 will be described.

Figure 8:
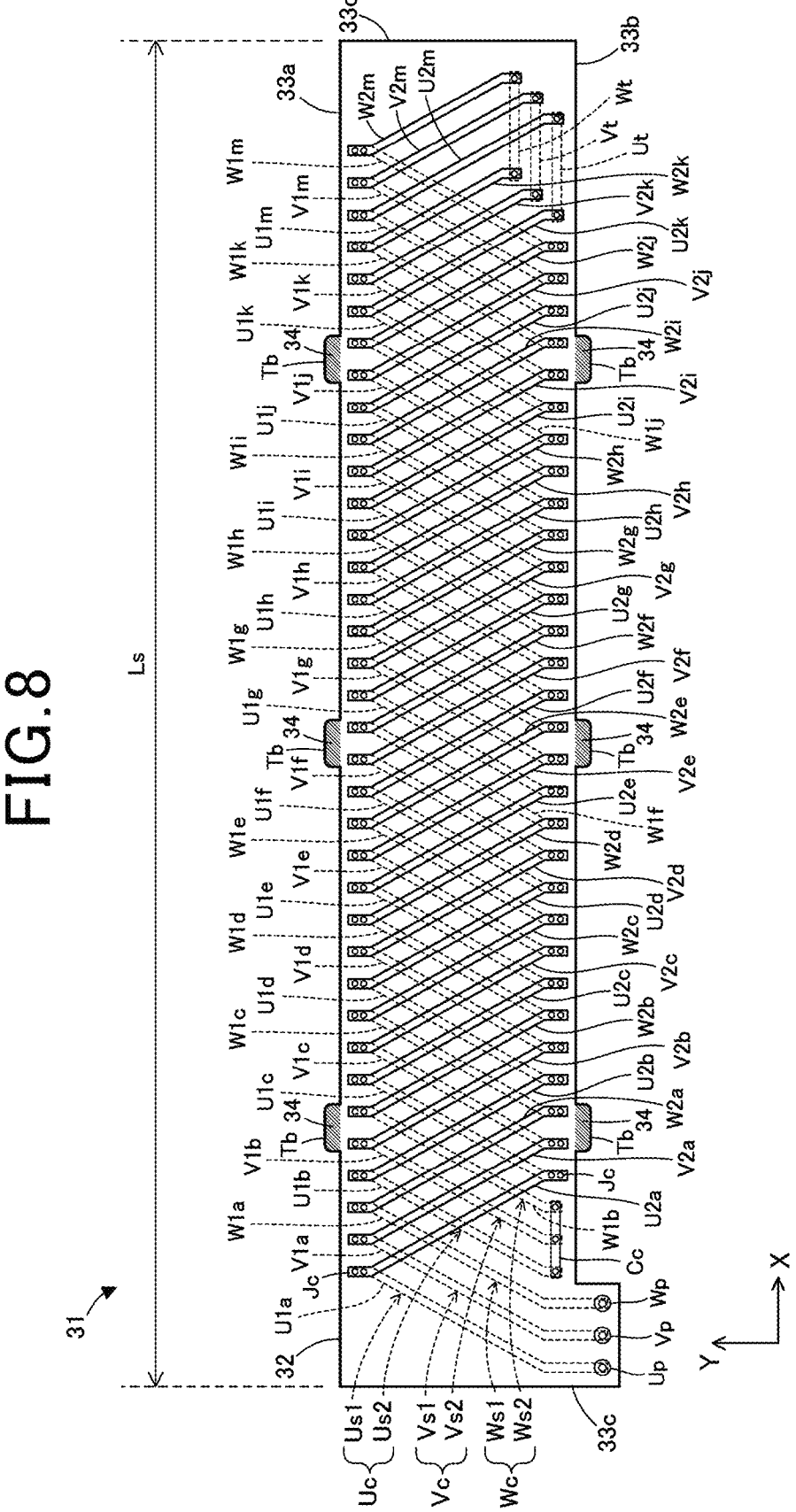
FIG. 8 is a diagram showing a configuration of a flexible circuit board forming the board laminate shown in FIG. 7.

FIG. 8 is a diagram showing a configuration of the flexible circuit board 31. In FIG. 8, the same components as those of the flexible circuit board 10 shown in FIG. 1 are denoted by the same reference signs as those in FIG. 1, and the description thereof quotes the description regarding FIG. 1 mentioned above.

Figure 9:
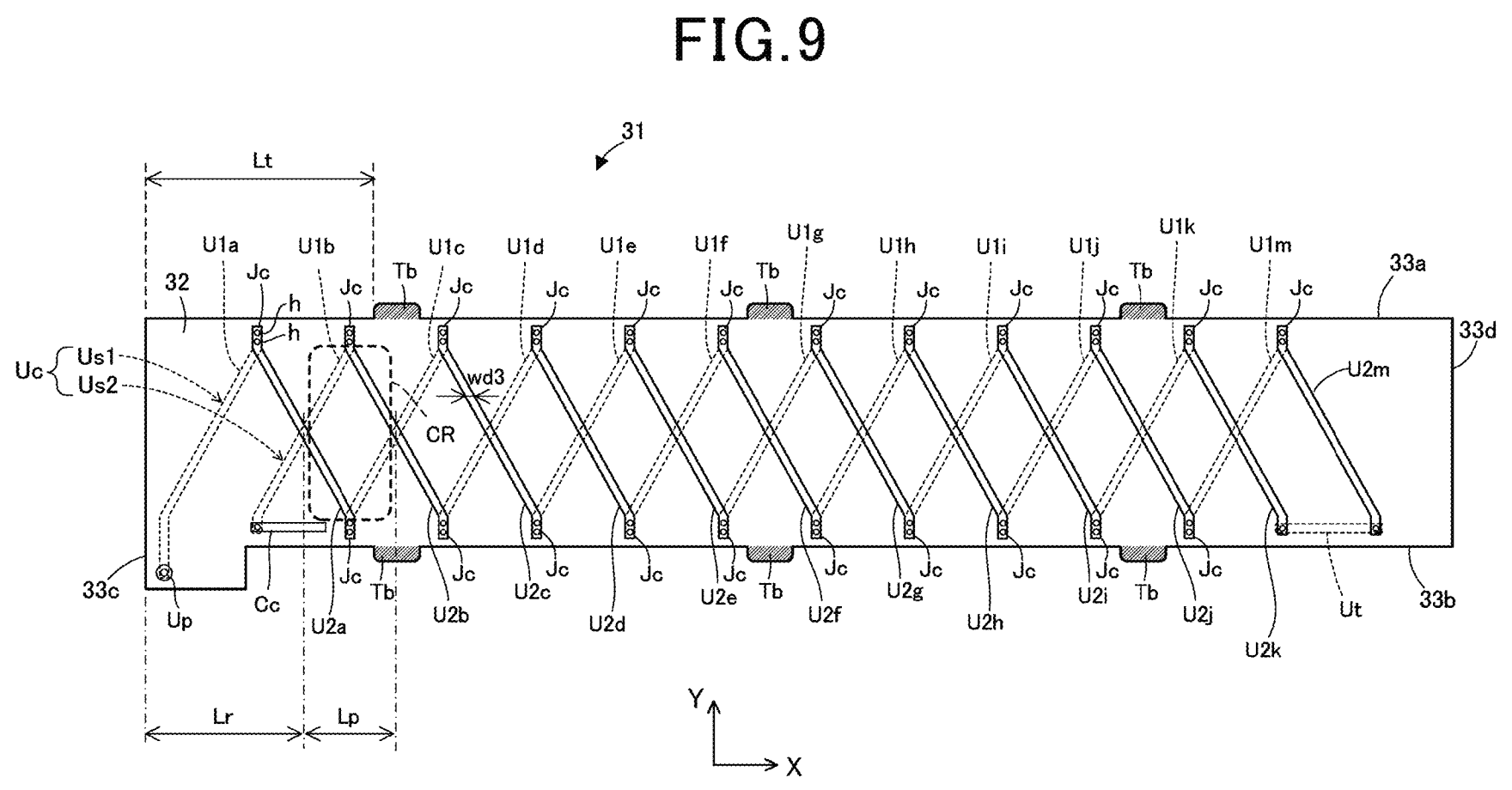

FIG. 9 is a diagram showing only the continuous wire Uc, to which the U-phase current is applied, of the three continuous wires Uc, Vc, and Wc formed on the flexible circuit board 31 shown in FIG. 8, and is a figure corresponding to FIG. 2 mentioned above. In FIG. 9, the same components as those of the flexible circuit board 10 shown in FIG. 2 are denoted by the same reference signs as those in FIG. 2, and the description thereof quotes the description regarding FIG. 2 mentioned above. In FIG. 8, the other two continuous wires Vc and Wc, respectively connected to external terminals Vp and Wp, to which V-phase and W-phase currents are applied are constructed similarly to the continuous wire Uc of the U-phase shown in FIG. 9.

With reference to FIGS. 8 and 9, the flexible circuit board 31 has the same configuration as the flexible circuit board 10 described above with reference to FIGS. 1 and 2, but differs in that the flexible circuit board 31 includes an insulating sheet 32 instead of the insulating sheet 11. The insulating sheet 32 has the same configuration as the insulating sheet 11, but differs in that the two long sides 33a and 33b of the strip-shaped insulating sheet 32 respectively have protrusions Tb that protrude from the long sides 33a and 33b toward the outside in the width direction of the insulating sheet 32.

As shown in FIGS. 8 and 9, the vias h connecting the first partial wires U1, V1, W1 and the second partial wires U2, V2, W2 are provided in the connection conductor portion Jc placed along the long sides 33a and 33b also in the flexible circuit board 31, similarly to the flexible circuit board 10.

The protrusions Tb are used to meet the relative positions of a plurality of the stacked flexible circuit boards 31 in assembling the board laminate 30. Specifically, a plurality of the flexible circuit boards 31 are stacked so that the positions of the protrusions Tb of the flexible circuit boards 31 match each other (for example, so that the outer edges of the protrusions Tb match each other). Then a plurality of the stacked flexible circuit boards 31 are bent into a cylindrical shape so that both longitudinal end portions of each flexible circuit board 31, which are short sides 33c and 33d, face each other, to form the board laminate 30.

The inner circumference of the case 42 of the motor 40 into which the board laminate 30 is installed may be provided with grooves into which the protrusions Tb of the flexible circuit board fit.

Figure 12:
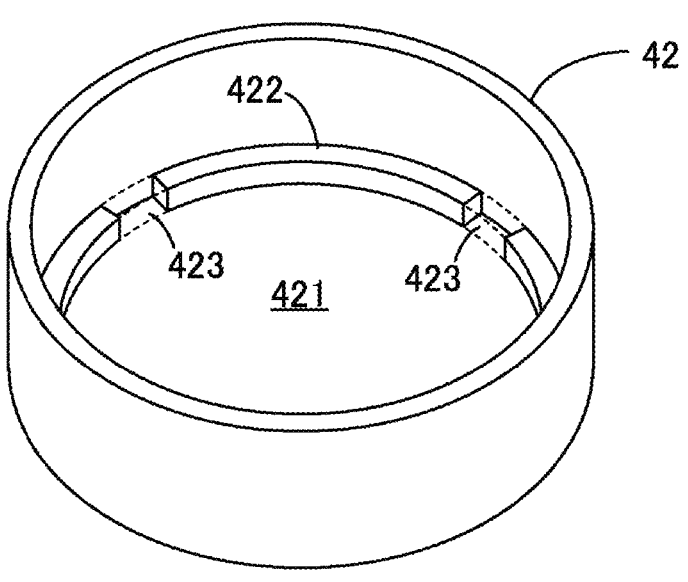
FIG. 12 is a diagram showing an example of a configuration of a magnetic material case in which a board laminate is placed in the motor shown in FIG. 11.

FIG. 12 is a diagram showing an example of a configuration of the case 42. The case 42 is provided with a ring-shaped projection 422 on the inner circumference of an internal bottom surface 421. In part of the projection 422, there are provided grooves 423 into which the protrusions Tb of the flexible circuit board 31 fit. The number of grooves 423 is the same as the number of protrusions Tb on each flexible circuit board 31.

When the flexible circuit boards 31 are assembled one by one into the case 42 to assemble the board laminate 30 inside the case 42, the flexible circuit boards 31 just need to be assembled into the case 42 so that the protrusions Tb fit into the grooves 423 sequentially from the flexible circuit board 31 placed on the outer circumference of the board laminate 30.

A plurality of the flexible circuit boards 31 forming the board laminate 30 are stacked so that the outer edges of the protrusions Tb match each other. This stacks the wiring patterns, such as the first continuous portion Us1 formed on each flexible circuit board 31, in the normal direction of the main surface of the flexible circuit boards 31. As a result, each of the annular portions CR formed by the continuous wires formed on the flexible circuit boards 31 is in a state in which the annular portions CR corresponding among the flexible circuit boards 31 are laminated together.

When a plurality of the flexible circuit boards 31 stacked in this way are assembled into the motor 40, the external terminals Up are connected to each other via, for example, a terminal of a terminal block placed on the outer wall of the case 42, and the same applies to the external terminals Vp and the external terminals Wp. Thereby, the laminated annular portions each form laminated coils mutually connected in parallel.

With reference to FIG. 8, each protrusion Tb is also formed with a heat conduction pattern 34 (hatched portion in the figure) made of a material with higher thermal conductivity than the material of the insulating sheet 32. In the present embodiment, the heat conduction pattern is made of the same metal as the conductor pattern such as the first partial wires U1, for example. The metal is, for example, copper (Cu).

As a result, when the flexible circuit board 31 is incorporated into the motor 40 as part of the board laminate 30, the heat generated in the flexible circuit board 31 is transmitted from the heat conduction pattern 34 of the protrusion Tb to the case 42, and is dissipated from the outer surface of the case 42 to the outside of the motor 40.

In particular, in the flexible circuit board 31, the vias h that are likely generate heat are provided in the connection conductor portion Jc placed along the long sides 33a and 33b, and protrusions Tb having heat conduction patterns 34 are provided on the long sides 33a and 33b. Therefore, when the flexible circuit board 31 is assembled into the motor 40, the heat generated in the vias h is conducted along the connection conductor portion Jc toward the long sides 33a and 33b, and is then quickly conducted to the case 42 from the protrusions Tb each provided with the heat conduction pattern 34, and is efficiently dissipated to the outside of the motor 40.

Note that in the present embodiment, three protrusions Tb are provided on each of the long sides 33a and 33b of the flexible circuit board 31, but the number and arrangement of the protrusions Tb are not limited to this. The number of protrusions Tb may be at least one. Furthermore, the protrusions Tb may be placed on one or both of the long sides 33a and 33b.

Inside the cylinder formed by the board laminates 30, the longer the distance from the central axis of the cylinder, the longer the circumference. For this reason, in the present embodiment, total lengths Ls of the insulating sheets 32 of the flexible circuit boards 31 are varied depending on the positions in the board laminate 30. Each total length Ls is the distance from the short side 33c to the short side 33d of the strip-shaped insulating sheet 32, as shown in FIG. 9. Note that since the total length of the insulating sheet 32 is equal to the total length of the flexible circuit board 31, hereinafter, the total length Ls of the insulating sheet 32 is also referred to as the total length Ls of the flexible circuit board 31.

In the present embodiment, in the board laminate 30, the flexible circuit board 31 has a longer total length Ls of the insulating sheet 32 as the flexible circuit board 31 is placed further from the central axis of the cylinder formed by the board laminate 30. As described above, in the board laminate 30 of the present embodiment, the flexible circuit boards 31a, 31b, 31c, and 31d are arranged in this order from the inner circumference to the outer circumference (FIG. 7). Therefore, when the total lengths Ls of the flexible circuit boards 31a, 31b, 31c, and 31d are respectively defined as Lsa, Lsb, Lsc, and Lsd, these total lengths are set to have the relationship expressed by the following Expression (2).

$$Lsa < Lsb < Lsc < Lsd \qquad (2)$$

Here, each of Lsa, Lsb, Lsc, and Lsd can be determined, for example, based on the radius from the central axis of the cylinder to the midpoint of the thickness of the corresponding flexible circuit board 31 in the board laminate 30 formed to be a cylinder.

In the present embodiment, the flexible circuit board 31 has a total length Ls of the insulating sheet 32 set longer as the flexible circuit board 31 is placed further from the central axis of the cylinder formed by the board laminate 30. Accordingly, as the flexible circuit board 31 is placed further from the central axis, the flexible circuit board 31 has a distance set longer, which is measured in the longitudinal direction (X direction) of the insulating sheet 32 from one longitudinal end of the insulating sheet 32 to a protrusion Tb.

For example, in FIG. 9, a distance Lt is defined as the distance measured in the longitudinal direction (X direction) of the insulating sheet 32 from the short side 33c, which is one end in the longitudinal direction of the insulating sheet 32, to the left end of the protrusion Tb formed on the left side of the long side 33a in the figure. Then, the flexible circuit board 31 has a Lt set longer as the flexible circuit board 31 is placed further from the central axis of the cylinder formed by the board laminate 30.

Specifically, when the distances Lt in the flexible circuit boards 31a, 31b, 31c, and 31d are respectively defined as Lta, Ltb, Ltc, and Ltd, the distances Ltb, Ltc, and Ltd on the flexible circuit boards 31b, 31c, and 31d are determined with the following Expressions (3), (4), and (5) with the distance Lta on the flexible circuit board 31a as a reference.

$$Ltb = Lta \times Lsb/Lsa \tag{3}$$

$$Ltc = Lta \times Lsc/Lsa \tag{4}$$

$$Ltd = Lta \times Lsd/Lsa \tag{5}$$

The positions of other protrusions Tb are set in the same manner.

Due to this, when a plurality of the flexible circuit boards 31 are stacked to form the cylindrical board laminate 30, the positions of the protrusions Tb corresponding among a plurality of the flexible circuit boards 31 are aligned in the cylinder. This allows improving accuracy in alignment of a plurality of the flexible circuit boards 31 in the board laminate 30. The accuracy in alignment includes accuracy in alignment of the entire outer edge among the insulating sheets 32 and accuracy in alignment among the partial wires corresponding among the insulating sheets 32.

Furthermore, in the present embodiment, there are a plurality of the annular portions CR ranged in a chain-like shape in each of the continuous wires formed on the insulating sheet 32 of the flexible circuit board 31. Regarding each of the annular portions CR, as the flexible circuit board 31 is placed further from the central axis of the cylinder formed by the board laminate 30, the flexible circuit board 31 has a distance set longer which is measured in the longitudinal direction (X direction) of the insulating sheet 32 from one end in the longitudinal direction of the insulating sheet 32 to an annular portion CR.

Furthermore, as the flexible circuit board 31 is placed further from the central axis of the cylinder formed by the board laminate 30, the flexible circuit board 31 has a length of the annular portion CR set longer that is measured in the longitudinal direction (X direction) of the insulating sheet 32.

For example, in FIG. 9, a distance Lr is defined as the distance measured in the longitudinal direction (X direction) of the insulating sheet 32 from the short side 33c, which is one end in the longitudinal direction of the insulating sheet 32, to the left end of the diamond-shaped annular portion CR formed on the left side in the figure. Then, the flexible circuit board 31 has a Lr set longer as the flexible circuit board 31 is placed further from the central axis of the cylinder formed by the board laminate 30.

Furthermore, in FIG. 9, for example, a distance Lp is defined as the length measured in the longitudinal direction (X direction) of the insulating sheet 32 from the left end to the right end of the diamond-shaped annular portion CR formed on the left side of the insulating sheet 32 in the figure. Then, the flexible circuit board 31 has a Lp set longer as the flexible circuit board 31 is placed further from the central axis of the cylinder formed by the board laminate 30.

Specifically, when the distances Lr in the flexible circuit boards 31a, 31b, 31c, and 31d are respectively defined as Lra, Lrb, Lrc, and Lrd, the distances Lrb, Lrc, and Lrd on the flexible circuit boards 31b, 31c, and 31d are determined with the following Expressions (6), (7), and (8) with the distance Lra on the flexible circuit board 31a as a reference.

$$Lrb = Lra \times Lsb/Lsa \tag{6}$$

$$Lrc = Lra \times Lsc/Lsa \tag{7}$$

$$Lrd = Lra \times Lsd/Lsa \tag{8}$$

Furthermore, when the lengths Lp of the annular portions of the flexible circuit boards 31a, 31b, 31c, and 31d are respectively defined as Lpa, Lpb, Lpc, and Lpd, the distances Lpb, Lpc, and Lpd on the flexible circuit boards 31b, 31c, and 31d are determined with the following Expressions (9), (10), and (11) with the distance Lpa on the flexible circuit board 31a as a reference.

$$Lpb = Lpa \times Lsb/Lsa \tag{9}$$

$$Lpc = Lpa \times Lsc/Lsa \tag{10}$$

$$Lpd = Lpa \times Lsd/Lsa \tag{11}$$

All the annular portions in each of the U-phase, V-phase, and W-phase continuous wires formed on the insulating sheet 32 each have a position and a length set in the same manner as above.

As a result, when a plurality of flexible circuit boards 31 are stacked to form the cylindrical board laminate 30, the wires, which form the annular portions CR corresponding among a plurality of the flexible circuit boards 31, are stacked with high positional accuracy among the flexible circuit boards 31.

Furthermore, in the present embodiment, all the partial wires such as the first partial wires U1 and the second partial wires U2, which form the continuous wires formed on the insulating sheet 32 of the flexible circuit board 31, each have a width. The width is set longer as the flexible circuit board 31 is placed further from the central axis of the cylinder formed by the board laminate 30. The width of each partial wire in the above can be defined, for example, as the thickness wd3 in the longitudinal direction (X direction) of the insulating sheet 32, as shown in FIG. 10.

Figure 10:
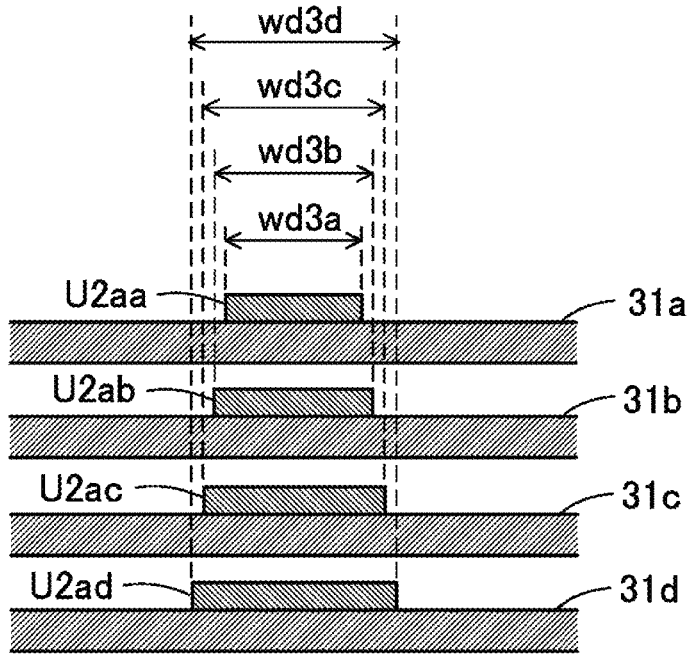
FIG. 10 is a cross-sectional view taken along a line X-X of the board laminate shown in FIG. 7.

As an example, FIG. 10 is a cross-sectional view taken along a line X-X in FIG. 7, and is a diagram showing a cross section of a portion in the board laminate 30. At this portion, portions of a plurality of the flexible circuit boards 31 are stacked in which the second partial wires U2*a* are formed. In FIG. 10, the second partial wires U2*a* in the flexible circuit boards 31*a*, 31*b*, 31*c*, and 31*d* are shown as second partial wires U2*aa*, U2*ab*, U2*ac*, and U2*ad*, respectively. Furthermore, widths wd3 of the partial wires in the flexible circuit boards 31*a*, 31*b*, 31*c*, and 31*d* are shown as widths wd3*a*, wd3*b*, wd3*c*, and wd3*d*.

As shown in the figure, in the present embodiment, the widths wd3*b*, wd3*c*, and wd3*d* of the flexible circuit boards 31*b*, 31*c*, and 31*d* are set larger toward the outer circumference in order from the width wd3*a* of the innermost circumference flexible circuit board 31*a* in the board laminate 30. In other words, the widths are set to widths expressed by the following Expression (12).

$$wd3a < wd3b < wd3c < wd3d \qquad (11)$$

This can increase the total cross-sectional area of the second partial wires U2*a*, to which the U-phase current is applied in a plurality of the flexible circuit boards 31 as a whole forming the board laminate 30, compared to the area with a configuration in which widths W3*a*, w3*b*, w3*c*, and w3*d* are all the same thickness. The same applies to partial wires other than the second partial wires U2*a*.

This causes the board laminate 30 to have a further reduced DC resistance of the U-phase, V-phase, and W-phase continuous wires Uc, Vc, and Wc, allowing the motor 40 including the board laminate 30 to have reduced operating voltage and reduced power consumption.

[2.3 Modification]

Next, modifications of the flexible circuit board 31 forming the board laminate 30 according to the second embodiment will be described.

[2.3.1 First Modification]

Figure 13:
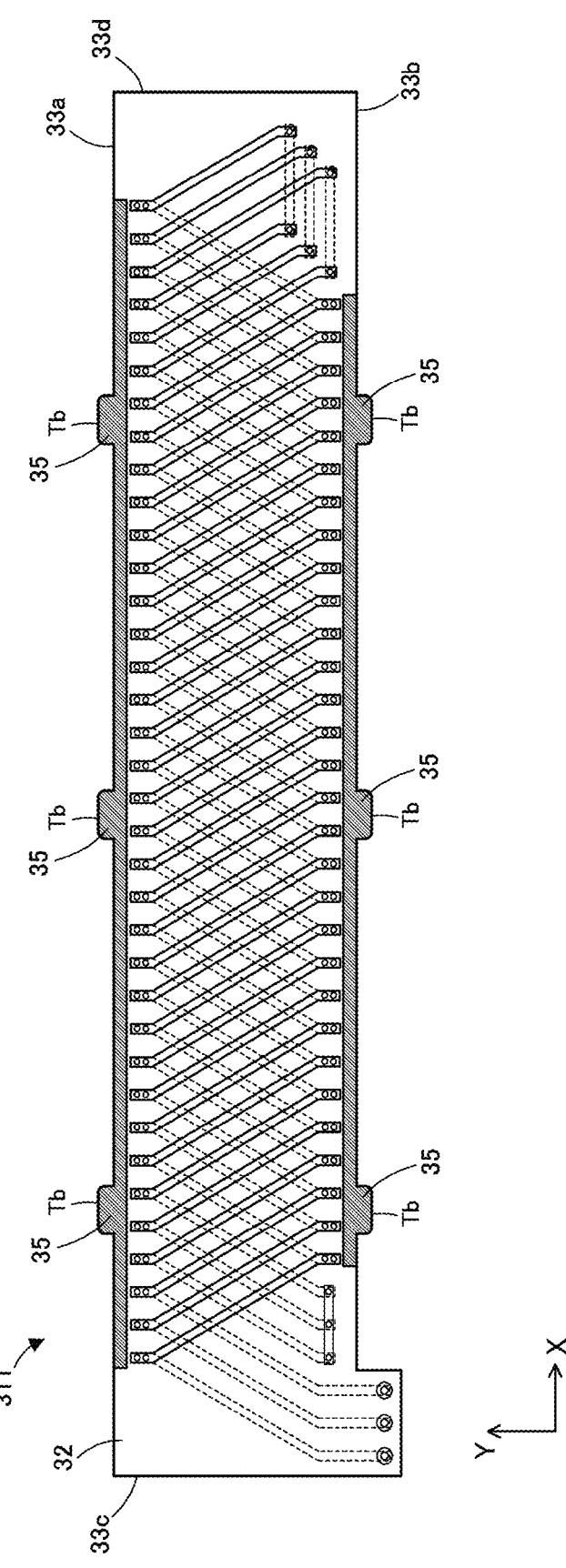
FIG. 13 is a diagram showing a configuration of a flexible circuit board according to a first modification of the second embodiment.

FIG. 13 is a diagram showing a configuration of a flexible circuit board 311 according to a first flexible circuit board 311 can be used in the board Note that, in FIG. 13, reference signs related to wires such as the first partial wires U1*a* are omitted.

The flexible circuit board 311 has the same configuration as the flexible circuit board 31, but differs in that it has a heat conduction pattern 35 instead of the heat conduction pattern 34. The heat conduction pattern 35 has the same configuration as the heat conduction pattern 34, but is formed to extend from the protrusion Tb to the long side 33*a* or 33*b* of the insulating sheet 11 on which the protrusion Tb is provided. The heat conduction pattern 35 extends, for example, in the long side 33*a* or 33*b* in an area where the connection conductor portion Jc is formed.

The flexible circuit board 311 allows the heat generated in the vias h of the connection conductor portion Jc to be efficiently conducted to the protrusion Tb, and allows the heat to be more effectively dissipated through the case 42 of the motor 40.

[2.3.2 Second Modification]

Figure 14:
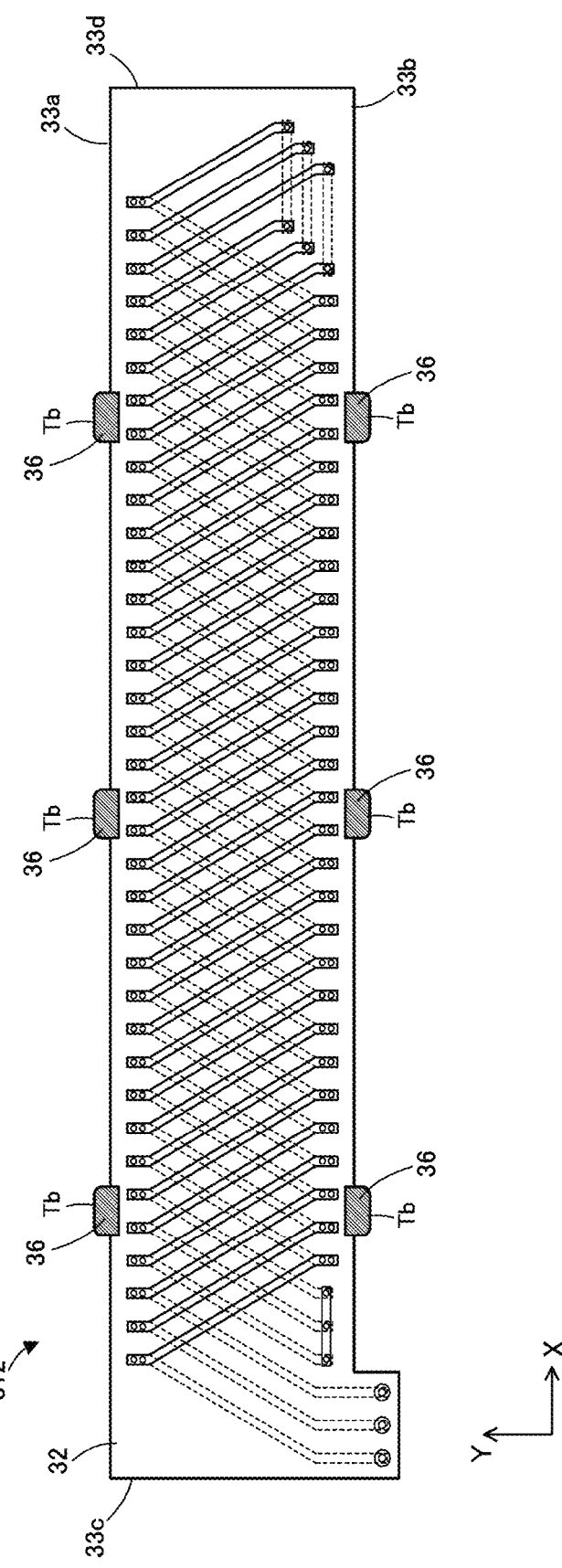
FIG. 14 is a diagram showing a configuration of a flexible circuit board according to a second modification of the second embodiment.

FIG. 14 is a diagram showing a configuration of a flexible circuit board 312 according to a second flexible circuit board 312 can be used in the board Note that, in FIG. 14, reference signs related to wires such as the first partial wires U1*a* are omitted.

The flexible circuit board 312 has the same configuration as the flexible circuit board 31, but the protrusions Tb are not formed as part of the insulating sheet 32 and are made of a material having higher thermal conductivity than the insulating sheet 32. Specifically, each protrusion Tb is formed by a heat conduction plate 36 that is separate from the insulating sheet 32 and made of a material with higher thermal conductivity (for example, copper, aluminum, etc.). The heat conduction plates 36 are fixed to the long sides 33*a* and 33*b* of the insulating sheet 32 by, for example, soldering or brazing.

According to this configuration, since the entire protrusions Tb are made of a material with higher thermal conductivity, the heat generated in the vias h of the connection conductor portions Jc can be dissipated more effectively.

[2.3.2 Third Modification]

Figure 15:
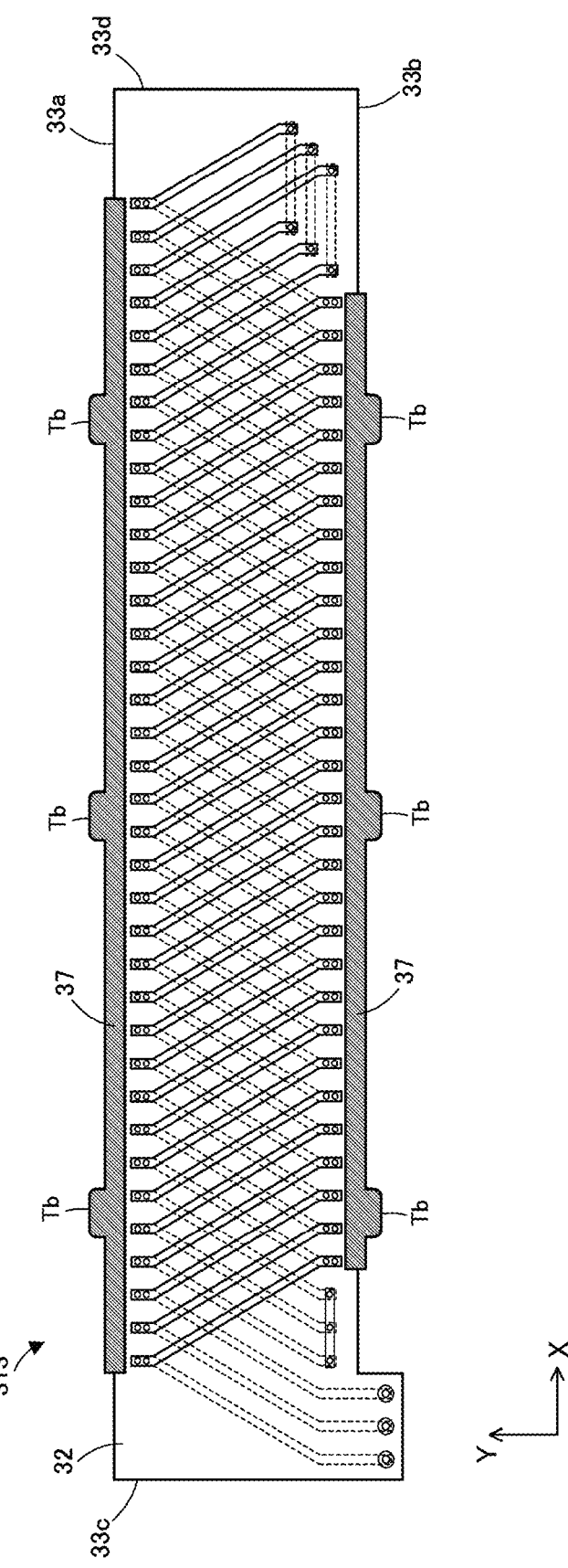
FIG. 15 is a diagram showing a configuration of a flexible circuit board according to a third modification of the second embodiment.

FIG. 15 is a diagram showing a configuration of a flexible circuit board 313 according to a third flexible circuit board 313 can be used in the board Note that, in FIG. 15, reference signs related to wires such as the first partial wires U1*a* are omitted.

The flexible circuit board 313 has the same configuration as the flexible circuit board 31, but differs in that it includes an outer edge plates 37 that are placed along the long sides 33*a* and 33*b* of the insulating sheet 32 and are made of a material with higher thermal conductivity than the insulating sheet 32 (for example, copper, aluminum, etc.). Furthermore, the flexible circuit board 313 differs from the flexible circuit board 31 in that the protrusions Tb are not formed as part of the insulating sheet 32 but are part, of the outer edge plate 37, extending from the outer edge plate 37. The outer edge plate 37 extends, for example, in the long side 33*a* or 33*b* in areas where the connection conductor portion Jc are formed. Furthermore, the outer edge plates 37 are fixed to the long sides 33*a* and 33*b* of the insulating sheet 32 by, for example, soldering or brazing.

According to this configuration, since the protrusions Tb are formed as portions of the outer edge plates 37 placed along the long sides 33*a* and 33*b* and having a higher thermal conductivity than the insulating sheet 32, allowing the heat generated in the vias h of the connection conductor portion Jc to be more effectively dissipated.

3. Other Embodiments

In the flexible circuit board 10 shown in the first embodiment described above, the continuous wires Uc, Vc, and Wc of the U-phase, V-phase, and W-phase respectively forms diamond-shaped annular portions CR that are ranged in a chain-like shape in a projection plan view seen in the normal direction of the main surface of the insulating sheet 11. However, the shape of each annular portion CR is not limited to a diamond shape, but may be any shape. From the point of view of obtaining as large a generated magnetic force as possible in the coil formed by the annular portion CR, the annular portion CR desirably has a shape such that a region included in the annular portion CR has a large area.

For example, the annular portion CR may be a polygon such as a hexagon, an ellipse, or a circle. Such shapes of the annular portion CR can be realized by forming partial wires, such as the first partial wires U1 formed on each of the first and second main surfaces of the insulating sheet 11, to have shapes of polygonal lines or curves. The same applies to the flexible circuit board 31 shown in the second embodiment.

Each flexible circuit board 10 according to the first embodiment described above may include protrusions Tb similarly to the flexible circuit board 31 according to the second embodiment. As a result, for example, the case 23 of the motor 20 can be made to have the same configuration as the case 42 shown in FIG. 11, to determine the positions of the flexible circuit boards 10 inside the case 23 with the protrusions Tb and efficiently dissipate the heat generated from the vias h of the connection conductor portion Jc.

In the first and second embodiments described above, as an example, the flexible circuit boards 10 and the board laminate 30 are used for each of the motors 20 and 40, which are three-layer brushless motors. However, the motors 20 and 40 are each an example, and the flexible circuit boards 10 and the board laminate 30 can be used for a generator having the same configuration as the motors 20 and 40.

Furthermore, each flexible circuit board 10 according to the first embodiment and each flexible circuit board 31 according to the second embodiment have three continuous wires to which three-phase currents, U-phase, V-phase, and W-phase, are respectively applied. However, the number of continuous wires is not limited to three. Depending on the number of operating phases of the rotating electrical machine to which the flexible circuit boards 10 or the board laminate 30 is applied, a number of continuous wires other than three may be formed on each of the flexible circuit boards 10 and 31.

[4. Configuration Supported by the Above Embodiments]

The embodiments and modifications described above support the following configurations.

(Configuration 1)

A board laminate including a plurality of strip-shaped flexible circuit boards bent into a cylindrical shape and stacked in a radial direction of the cylinder, in which each of a plurality of the flexible circuit boards includes a strip-shaped insulating sheet and a plurality of partial wires formed on each of two opposing main surfaces of the insulating sheet, each of a plurality of the flexible circuit boards includes at least one protrusion that is placed on at least one of two long sides extending in a longitudinal direction of the strip-shaped insulating sheet and protrudes from the long side toward an outside of the insulating sheet, and when a plurality of the flexible circuit boards are stacked so as to align the protrusions corresponding among the flexible circuit boards, the protrusions of the flexible circuit boards are each provided at a position where the partial wires corresponding among a plurality of the flexible circuit boards are to be stacked together.

The board laminate of Configuration 1 allows easily and accurately stacking the partial wires corresponding among a plurality of the flexible circuit boards forming the board laminate. Therefore, for example, forming coils on the flexible circuit boards allows improving the stacking accuracy of the coils corresponding among a plurality of the flexible circuit boards, to increase the strength of the generated magnetic field of the entire coils. This then allows contribution to realization of a highly energy-efficient rotating electrical machine.

(Configuration 2)

The board laminate according to Configuration 1, in which the protrusion of the flexible circuit board is provided with a heat transfer pattern made of a material with higher thermal conductivity than the insulating sheet.

The board laminate of Configuration 2 causes the heat generated in each flexible circuit board to be quickly conducted from the protrusion provided with the heat conduction pattern to the structure such as the housing that houses the board laminate. As a result, use of the board laminate of Configuration 2 for a rotating electrical machine allows preventing temperature rise of the magnetic material such as a stator and preventing decrease in the magnetic susceptibility. This then allows contribution to realization of a highly energy-efficient rotating electrical machine.

(Configuration 3)

The board laminate according to Configuration 2, in which the heat transfer pattern is formed so as to extend from the protrusion to a long side of the insulating sheet.

The board laminate of Configuration 3 causes the heat generated in each flexible circuit board to be more quickly conducted from a wide area of the protrusion provided with the heat conduction pattern and the long side portion of each insulating sheet to a structure such as a housing that houses the board laminate. This allows the heat to be dissipated more efficiently.

(Configuration 4)

The board laminate according to Configuration 1, in which the protrusion of the flexible circuit board is made of a material with higher thermal conductivity than the insulating sheet.

The board laminate of Configuration 4 causes each of the entire protrusions to be made of a material with higher thermal conductivity, allowing the heat generated in the flexible circuit board to be dissipated more efficiently.

(Configuration 5)

The board laminate according to Configuration 4, in which the flexible circuit board has at least one outer edge plate placed along the at least one of two long sides of the insulating sheet and made of a material with higher thermal conductivity than the insulating sheet, and the at least one protrusion is a portion of the outer edge plate, the portion extending from the outer edge plate.

The board laminate of Configuration 5 allows each of the outer edge plates, which is made of a material with higher thermal conductivity and includes the protrusion, to be placed over a wide area of the long side of the insulating sheet, allowing heat generated in the flexible circuit board to be dissipated more efficiently.

(Configuration 6)

The board laminate according to any of Configurations 1 to 5, in which a plurality of the protrusions of the flexible circuit board are placed on the opposing two long sides of the insulating sheet.

The board laminate of Configuration 6 allows the heat generated in the flexible circuit board to be more efficiently dissipated from the protrusion placed on the opposing two long sides.

(Configuration 7)

The board laminate according to any of Configurations 1 to 6, in which each of a plurality of the flexible circuit boards includes at least one continuous wire formed on the insulating sheet, and the continuous wire includes a first continuous portion and a second continuous portion, each formed by a plurality of the partial wires formed on two opposing main surfaces of the insulating sheet, the partial wires formed on each of the main surfaces being alternately connected in cascade via vias, the first continuous portion and the second continuous portion extending in the longitudinal direction of the insulating sheet.

The board laminate of Configuration 7 allows easily and accurately stacking the continuous wires corresponding among a plurality of the flexible circuit boards forming the board laminate, which continuous wires each have a long length extending in the longitudinal direction of the insulating sheet. Therefore, when the coils are formed on the flexible circuit boards, for example, the configuration improves the stacking accuracy of the coils corresponding among a plurality of the flexible circuit boards and increases the strength of the generated magnetic field of the entire coils. This then allows contribution to realization of a highly energy-efficient rotating electrical machine.

(Configuration 8)

The board laminate according to Configuration 7, in which, in each of a plurality of the flexible circuit boards, the first continuous portion and the second continuous portion cross in a chain-like shape in a projection plan view seen in a normal direction of a main surface of the insulating sheet without electrical continuity with each other to form a plurality of annular portions ranged in a chain-like shape, and each of the annular portions forms a coil.

The board laminate of configuration 8 allows easily and accurately stacking the annular portions, each of which can form a coil, among a plurality of the flexible circuit boards forming the board laminate. This allows increasing the strength of the magnetic field generated as a whole of the laminated coils, each of which laminated coils can be formed by the stacked annular portions. This then allows contribution to realization of a highly energy-efficient rotating electrical machine.

(Configuration 9)

The board laminate according to Configuration 7 or 8, in which each of a plurality of the flexible circuit boards is provided with a plurality of the continuous wires formed at mutually shifted positions in the longitudinal direction of the insulating sheet.

The board laminate of configuration 9 allows realizing a polyphase-alternating-current rotating electrical machine with high energy efficiency.

(Configuration 10)

A rotating electrical machine including: a stator including a board laminate according to Configuration 9; and a rotor placed inside a cylinder formed by the board laminate.

The rotating electrical machine of Configuration 10 allows providing a rotating electrical machine that has a reduced weight and an improved energy efficiency.

(Configuration 11)

A plurality of flexible circuit boards forming a board laminate according to any of Configurations 1 to 9, each of the flexible circuit boards including: a strip-shaped insulating sheet; a plurality of partial wires formed on each of two opposing main surfaces of the insulating sheet; and at least one protrusion that is placed on at least one of two long sides extending in a longitudinal direction of the strip-shaped insulating sheet and protrudes from the long side toward an outside of the insulating sheet.

The flexible circuit board of configuration 11 allows forming a board laminate that can contribute to realization of a rotating electrical machine with high energy efficiency.

REFERENCE SIGNS LIST 10, 101, 31, 31$a$, 31$b$, 31$c$, 31$d$, 311, 312, 313 . . . flexible circuit board, 11, 32 . . . insulating sheet, 12$a$, 12$b$, 33$a$, 33$b$ . . . long side, 12$c$, 12$d$, 33$c$, 33$d$ . . . short side, 20, 40 . . . motor, 21, 41 . . . stator, 22 . . . rotor, 23, 42 . . . case, 24 . . . rotating body, 25 . . . permanent magnet, 30 . . . board laminate, 34, 35 . . . heat conduction pattern, 36 . . . heat conduction plate, 37 . . . outer edge plate, 421 . . . internal bottom surface, 422 . . . projection, 423 . . . groove, h . . . via, Jc . . . connection conductor portion, Tb . . . protrusion, U1, U1$a$, U1$b$, U1$c$, U1$d$, U1$e$, U1$f$, U1$g$, U1$h$, U1$i$, U1$j$, U1$k$, U1$m$ . . . first partial wire of U-phase, V1, V1$a$, V1$b$, V1$c$, V1$d$, V1$e$, V1$f$, V1$g$, V1$h$, V1$i$, V1$j$, V1$k$, V1$m$ . . . first partial wire of V-phase, W1, W1$a$, W1$b$, W1$c$, W1$d$, W1$e$, W1$f$, W1$g$, W1$h$, W1$i$, W1$j$, W1$k$, W1$m$ . . . first partial wire of W-phase, U2, U2$a$, U2$b$, U2$c$, U2$d$, U2$e$, U2$f$, U2$g$, U2$h$, U2$i$, U2$j$, U2$k$, U2$m$ . . . second partial wire U-phase, V2, V2$a$, V2$b$, V2$c$, V2$d$, V2$e$, V2$f$, V2$g$, V2$h$, V2$i$, V2$j$, V2$k$, V2$m$ . . . second partial wire of V-phase, W2, W2$a$, W2$b$, W2$c$, W2$d$, W2$e$, W2$f$, W2$g$, W2$h$, W2$i$, W2$j$, W2$k$, W2$m$ . . . second partial wire of W-phase, Uc . . . continuous wire of U-phase, Vc . . . continuous wire of V-phase, Wc . . . continuous wire of W-phase, Us1 . . . first continuous portion of continuous wire of U-phase, Vs1 . . . first continuous portion of continuous wire of V-phase, Ws1 . . . first continuous portion of continuous wire of W-phase, Us2 . . . second continuous portion of continuous wire of U-phase, Vs2 . . . second continuous portion of continuous wire of V-phase, Ws2 . . . second continuous portion of continuous wire of W-phase, Ut . . . reversal portion of U-phase, Vt . . . reversal portion of V-phase, Wt . . . reversal portion of W-phase, Up . . . external terminal of U-phase, Vp . . . external terminal of V-phase, Wp . . . external terminal of W-phase, Cc . . . common connection portion, U11, U11$a$, U12$b$, U11$c$, U11$d$, U11$e$, U11$f$, U11$g$, U12$h$, U11$i$, U11$j$, U11$k$, U11$m$, U12, U12$a$, U12$b$, U12$c$, U12$d$, U12$e$, U12$f$, U12$g$, U12$h$, U12$i$, U12$j$, U12$k$, U12$m$ . . . double first partial wire of U-phase, U21, U21$a$, U21$b$, U21$c$, U21$d$, U21$e$, U21$f$, U21$g$, U21$h$, U21$i$, U21$j$, U21$k$, U21$m$, U22, U22$a$, U22$b$, U22$c$, U22$d$, U22$e$, U22$f$, U22$g$, U22$h$, U22$i$, U22$j$, U22$k$, U22$m$ . . . double second partial wire of U-phase, Us11, Us12 . . . double first continuous portion of continuous wire of U-phase, Us21, Us22 . . . double second continuous portion of continuous wire of U-phase, Ut1, Ut2 . . . double reversal portion of U-phase.

What is claimed is:

1. A board laminate comprising a plurality of strip-shaped flexible circuit boards bent into a cylindrical shape and stacked in a radial direction of the cylinder, wherein each of a plurality of the flexible circuit boards includes a strip-shaped insulating sheet and a plurality of partial wires formed on each of two opposing main surfaces of the insulating sheet, each of a plurality of the flexible circuit boards includes at least one protrusion that is placed on at least one of two long sides extending in a longitudinal direction of the strip-shaped insulating sheet and protrudes from the long side toward an outside of the insulating sheet, and when a plurality of the flexible circuit boards are stacked so as to align the protrusions corresponding among the flexible circuit boards, the protrusions of the flexible circuit boards are each provided at a position where the partial wires corresponding among a plurality of the flexible circuit boards are to be stacked together.

2. The board laminate according to claim 1, wherein the protrusion of the flexible circuit board is provided with a heat transfer pattern made of a material with higher thermal conductivity than the insulating sheet.

3. The board laminate according to claim 2, wherein the heat transfer pattern is formed so as to extend from the protrusion to a long side of the insulating sheet.

4. The board laminate according to claim 1, wherein the protrusion of the flexible circuit board is made of a material with higher thermal conductivity than the insulating sheet.

5. The board laminate according to claim 4, wherein the flexible circuit board has at least one outer edge plate placed along the at least one of two long sides of the insulating sheet and made of a material with higher thermal conductivity than the insulating sheet, and the at least one protrusion is a portion of the outer edge plate, the portion extending from the outer edge plate.

6. The board laminate according to claim 1, wherein a plurality of the protrusions of the flexible circuit board are placed on the opposing two long sides of the insulating sheet.

7. The board laminate according to claim 1, wherein each of a plurality of the flexible circuit boards includes at least one continuous wire formed on the insulating sheet, and the continuous wire includes a first continuous portion and a second continuous portion, each formed by a plurality of the partial wires formed on two opposing main surfaces of the insulating sheet, the partial wires formed on each of the main surfaces being alternately connected in cascade via vias, the first continuous portion and the second continuous portion extending in the longitudinal direction of the insulating sheet.

8. The board laminate according to claim 7, wherein, in each of a plurality of the flexible circuit boards, the first continuous portion and the second continuous portion cross in a chain-like shape in a projection plan view seen in a normal direction of a main surface of the insulating sheet without electrical continuity with each other to form a plurality of annular portions ranged in a chain-like shape, and each of the annular portions forms a coil.

9. The board laminate according to claim 7, wherein each of a plurality of the flexible circuit boards is provided with a plurality of the continuous wires formed at mutually shifted positions in the longitudinal direction of the insulating sheet.

10. A rotating electrical machine comprising:

a stator including a board laminate according to claim 9; and a rotor placed inside a cylinder formed by the board laminate.

11. A plurality of flexible circuit boards forming a board laminate according to claim 1, each of the flexible circuit boards comprising:

a strip-shaped insulating sheet;

a plurality of partial wires formed on each of two opposing main surfaces of the insulating sheet; and at least one protrusion that is placed on at least one of two long sides extending in a longitudinal direction of the strip-shaped insulating sheet and protrudes from the long side toward an outside of the insulating sheet.

* * * * *